United States Patent
Szalai et al.

(10) Patent No.: US 11,428,763 B2
(45) Date of Patent: Aug. 30, 2022

(54) PLANAR INVERSE ANAPOLE MICRORESONATOR AND PERFORMING INDUCTIVE-DETECTION ELECTRON PARAMAGNETIC RESONANCE SPECTROSCOPY

(71) Applicant: Government of the United States of America, as represented by the Secretary of Commerce, Gaithersburg, MD (US)

(72) Inventors: Veronika Ann Szalai, Monrovia, MD (US); Amit Kumar Agrawal, Rockville, MD (US); Nandita Abhyankar, Rockville, MD (US)

(73) Assignee: GOVERNMENT OF THE UNITED STATES OF AMERICA, AS REPRESENTED BY THE SECRETARY OF COMMERCE, Gaithersburg, MD (US)

(*) Notice: Subject to any disclaimer, the term of this patent is extended or adjusted under 35 U.S.C. 154(b) by 3 days.

(21) Appl. No.: 17/185,184

(22) Filed: Feb. 25, 2021

(65) Prior Publication Data
US 2021/0270916 A1 Sep. 2, 2021

Related U.S. Application Data

(60) Provisional application No. 63/055,816, filed on Jul. 23, 2020, provisional application No. 62/982,879, filed on Feb. 28, 2020.

(51) Int. Cl.
*G01R 33/345* (2006.01)
*G01R 33/46* (2006.01)
(Continued)

(52) U.S. Cl.
CPC ......... *G01R 33/3456* (2013.01); *G01R 33/46* (2013.01); *G01R 33/60* (2013.01); *H01P 7/082* (2013.01)

(58) Field of Classification Search
CPC ..... G01R 33/3456; G01R 33/46; G01R 33/60
See application file for complete search history.

(56) References Cited

U.S. PATENT DOCUMENTS

| 6,278,893 B1* | 8/2001 | Ardenkjær-Larson ...... G01R 33/5601 324/309 |
| 10,677,953 B2* | 6/2020 | Stetson ............. G01R 33/032 |

(Continued)

OTHER PUBLICATIONS

Basharin, A.A., et al., "Extremely high Q-factor metamaterials due to anapole excitation", Physical Review B, 2017, p. 035104, vol. 95.
(Continued)

*Primary Examiner* — Dixomara Vargas
(74) *Attorney, Agent, or Firm* — Office of Chief Counsel for National Institute of Standards and Technology

(57) ABSTRACT

A planar inverse anapole microresonator includes: an anapolic substrate; an anapolic conductor that includes a first and second inverse anapolic pattern; each inverse anapolic pattern including: a semi annular arm that terminates in a first arm tendril and a second arm tendril; and a medial arm terminating at a medial tip, and the medial tip of the first inverse anapolic pattern opposes the medial tip of the second inverse anapolic pattern, such that the medial tip of the first inverse anapolic pattern is separated from the medial tip of the second inverse anapolic pattern by a medial gap, and the planar inverse anapole microresonator produces a magnetic field region that concentrates a magnetic field localized between the medial tip of the first inverse anapolic pattern and the medial tip of the second inverse anapolic pattern in
(Continued)

response to the planar inverse anapole microresonator being subjected to microwave radiation.

17 Claims, 23 Drawing Sheets

(51) Int. Cl.
  *H01P 7/08* (2006.01)
  *G01R 33/60* (2006.01)

(56) References Cited

U.S. PATENT DOCUMENTS

| | | | | |
|---|---|---|---|---|
| 2010/0213941 | A1* | 8/2010 | Driesel | G01R 33/5659 |
| | | | | 324/322 |
| 2013/0093424 | A1* | 4/2013 | Blank | G01R 33/60 |
| | | | | 324/318 |
| 2014/0163664 | A1* | 6/2014 | Goldsmith | A61B 17/0057 |
| | | | | 604/93.01 |
| 2014/0285198 | A1* | 9/2014 | Halpern | G01V 3/104 |
| | | | | 324/322 |
| 2019/0247050 | A1* | 8/2019 | Goldsmith | A61F 2/82 |
| 2020/0303534 | A1* | 9/2020 | Ram | H01L 31/112 |
| 2020/0309602 | A1* | 10/2020 | El Fatimy | G01J 5/20 |
| 2021/0225531 | A1* | 7/2021 | Brown | G21B 3/00 |

OTHER PUBLICATIONS

Abhyankar, N., et al., "Highly Sensitive Microresonators for EPR Spectroscopy of Submicromolar Biomacromolecular Samples", GRC Conference 2019, Jan. 2019.

Abhyankar, N., et al., "Planar Anapole Microresonators for Inductive Detection EPR Spectroscopy", Rocky Mountain Conference on Magnetic Resonance, Snowbird Resort & Conference Center, Jul. 2018.

Szalai, V.A., et al., "Electron Paramagnetic Resonance (EPR) Spectroscopy for Bionanomaterial Measurements", Air Force Office of Science Research Biophysics Program Review, Apr. 2018.

* cited by examiner (A)

Coaxial cable jack

50 Ω load (A)

Twinax connector for modulation coil

Air core inductors acting as modulation coils

PLANAR INVERSE ANAPOLE MICRORESONATOR AND PERFORMING INDUCTIVE-DETECTION ELECTRON PARAMAGNETIC RESONANCE SPECTROSCOPY

CROSS REFERENCE TO RELATED APPLICATIONS

The application claims priority to U.S. Provisional Patent Application Ser. No. 63/055,816 filed Jul. 23, 2020, and U.S. Provisional Patent Application Ser. No. 62/982,879 filed Feb. 28, 2020, the disclosures of which are incorporated herein by reference in their entirety.

STATEMENT REGARDING FEDERALLY SPONSORED RESEARCH

This invention was made with United States Government support from the National Institute of Standards and Technology (NIST), an agency of the United States Department of Commerce under Agreement No. 70NANB10H193. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 20-031US1.

BRIEF DESCRIPTION

Disclosed is a planar inverse anapole microresonator comprising: an anapolic substrate; an anapolic conductor disposed on the anapolic substrate and comprising a first inverse anapolic pattern and a second inverse anapolic pattern arranged such that the second inverse anapolic pattern is disposed in a plane with the first inverse anapolic pattern and opposes the first inverse anapolic pattern; each inverse anapolic pattern comprising: a semi annular arm that terminates in a first arm tendril and a second arm tendril distal to the first arm tendril; and a medial arm extending from a concave portion of the semi annular arm and terminating at a medial tip distal to the concave portion of the semi annular arm so that the medial tip is separated from the first arm tendril and the second arm tendril and medially disposed between the first arm tendril and the second arm tendril, such that: the first arm tendril of the first inverse anapolic pattern opposes the first arm tendril of the second inverse anapolic pattern; the second arm tendril of the first inverse anapolic pattern opposes the second arm tendril of the second inverse anapolic pattern; and the medial tip of the first inverse anapolic pattern opposes the medial tip of the second inverse anapolic pattern, such that the medial tip of the first inverse anapolic pattern is separated from the medial tip of the second inverse anapolic pattern by a medial gap, and the planar inverse anapole microresonator produces a magnetic field region that concentrates a magnetic field localized between the medial tip of the first inverse anapolic pattern and the medial tip of the second inverse anapolic pattern in response to the planar inverse anapole microresonator being subjected to microwave radiation.

Disclosed is a process for performing inductive-detection electron paramagnetic resonance spectroscopy, the process comprising: communicating microwave radiation through a microwave conductor; subjecting an inverse anapolic pattern in an anapolic conductor to the microwave radiation from the microwave conductor; and creating a magnetic field region and concentrating a magnetic field localized between a medial tip of a first inverse anapolic pattern and a medial tip of a second inverse anapolic pattern of the inverse anapolic pattern in response to subjecting the inverse anapolic pattern to the microwave radiation from the microwave conductor to perform inductive detection electron paramagnetic resonance spectroscopy.

BRIEF DESCRIPTION OF THE DRAWINGS

The following description cannot be considered limiting in any way. With reference to the accompanying drawings, like elements are numbered alike.

DETAILED DESCRIPTION

Figure 1:
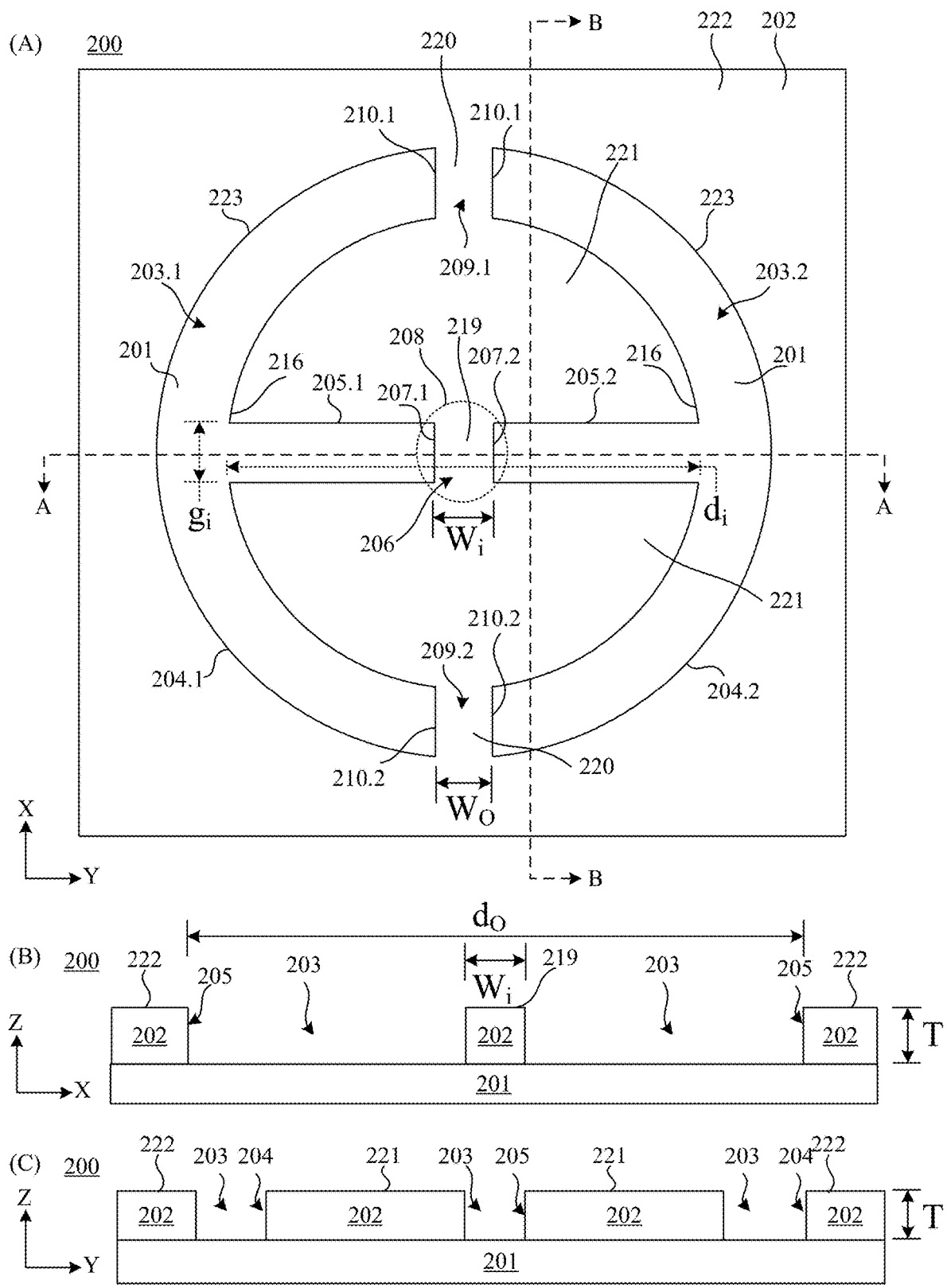
FIG. 1 shows a planar inverse anapole microresonator in panel A, a cross-section along line A-A thereof in panel B, and a cross-section along line B-B in panel C.

A detailed description of one or more embodiments is presented herein by way of exemplification and not limitation.

It has been discovered that a planar inverse anapole microresonator provides inductive-detection of electron spins in picoliter volumes. The planar inverse anapole microresonator has a spin detection limit that is an order of magnitude more sensitive than conventional microresonator devices. Conventional microresonators for spin detection in volume-limited samples can suffer from poor quality-factors, which adversely affects sensitivity. The planar inverse anapole microresonator includes an inverse anapole that produces a toroidal moment that decreases radiative loss in a planar format that confines microwave magnetic fields to picoliter volumes. The planar inverse anapole microresonator produces a magnetic field hotspot for inductive-detection electron magnetic resonance. The planar inverse anapole microresonator has a quality-factor that mediates facile coupling with a microwave feedline for continuous wave (CW) and pulsed electron paramagnetic resonance (EPR). The size of the magnetic field hotspot provides an active volume of the resonator for a sample that is smaller than overall dimensions of the planar inverse anapole microresonator and provides scalability to microwave frequencies that are greater than 100 GHz. The planar inverse anapole microresonator can be scaled for multiple frequencies and overcomes operational limitations of conventional microresonator devices.

Planar inverse anapole microresonator 200 produces a magnetic field region 208. In an embodiment, with reference to FIG. 1, FIG. 2, FIG. 3, and FIG. 4, planar inverse anapole microresonator 200 includes: anapolic substrate 201; anapolic conductor 202 disposed on anapolic substrate 201 and including first inverse anapolic pattern 203.1 and second inverse anapolic pattern 203.2 arranged such that second inverse anapolic pattern 203.2 is disposed in a plane with first inverse anapolic pattern 203.1 and opposes first inverse anapolic pattern 203.1; each inverse anapolic pattern 203 including: semi annular arm 204 that terminates in first arm tendril 210.1 and second arm tendril 210.2 distal to first arm tendril 210.1; and medial arm 205 extending from concave portion 216 of semi annular arm 204 and terminating at medial tip 207 distal to concave portion 216 of semi annular arm 204 so that medial tip 207 is separated from first arm tendril 210.1 and second arm tendril 210.2 and medially disposed between first arm tendril 210.1 and second arm tendril 210.2, such that: first arm tendril 210.1 of first inverse anapolic pattern 203.1 opposes first arm tendril 210.1 of second inverse anapolic pattern 203.2; second arm tendril 210.2 of first inverse anapolic pattern 203.1 opposes second arm tendril 210.2 of second inverse anapolic pattern 203.2; and medial tip 207.1 of first inverse anapolic pattern 203.1 opposes medial tip 207.2 of second inverse anapolic pattern 203.2, such that medial tip 207.1 of first inverse anapolic pattern 203.1 is separated from medial tip 207.2 of second inverse anapolic pattern 203.2 by medial gap 206, and planar inverse anapole microresonator 200 produces magnetic field region 208 that concentrates a magnetic field localized between medial tip 207.1 of first inverse anapolic pattern 203.1 and medial tip 207.2 of second inverse anapolic pattern 203.2 in response to planar inverse anapole microresonator 200 being subjected to microwave radiation 215. As shown in panel A of FIG. 1, concave portion 216 of inverse anapolic pattern 203 surrounds interior plenum 221 of anapolic conductor 202, and convex portion 223 of inverse anapolic pattern 203 borders exterior plenum 222 of anapolic conductor 202

Figure 2:
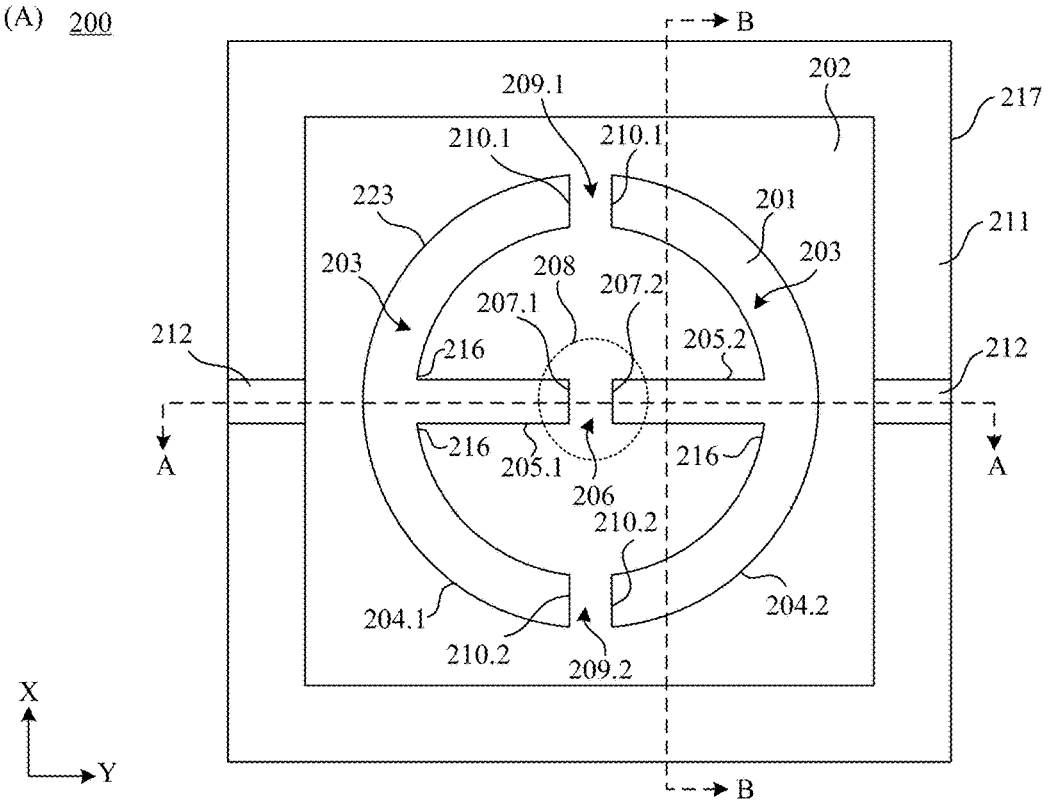
FIG. 2 shows a planar inverse anapole microresonator in panel A, a cross-section along line A-A thereof in panel B, and a cross-section along line B-B in panel C.
Figure 2:
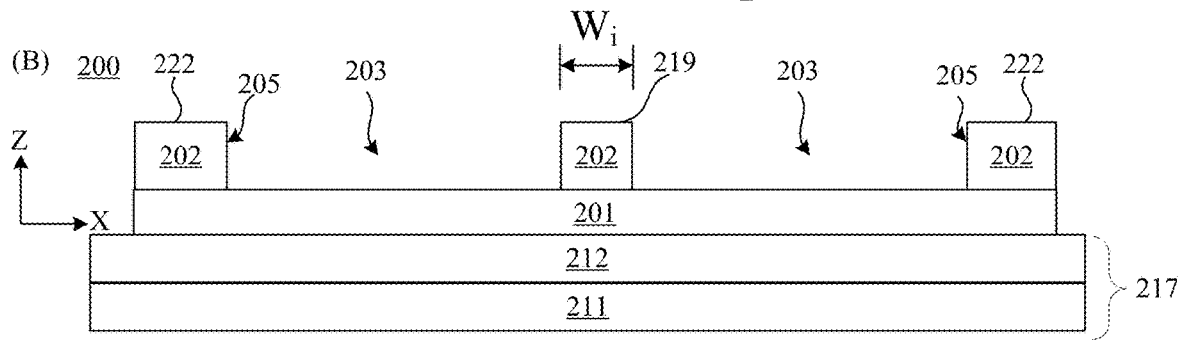
Figure 2:
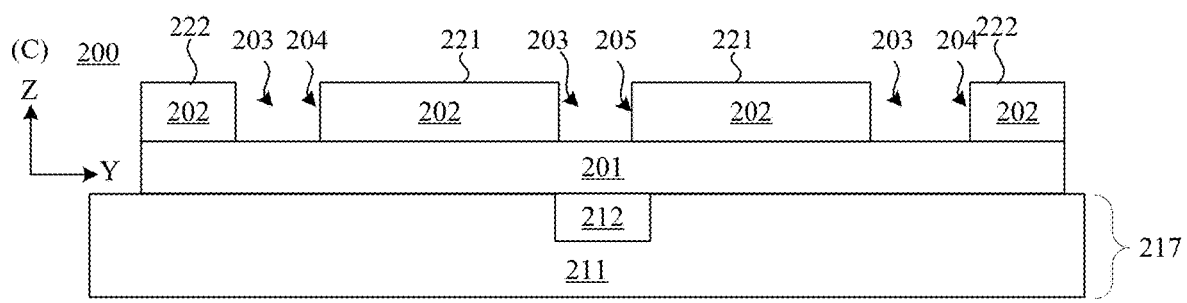
Figure 3:
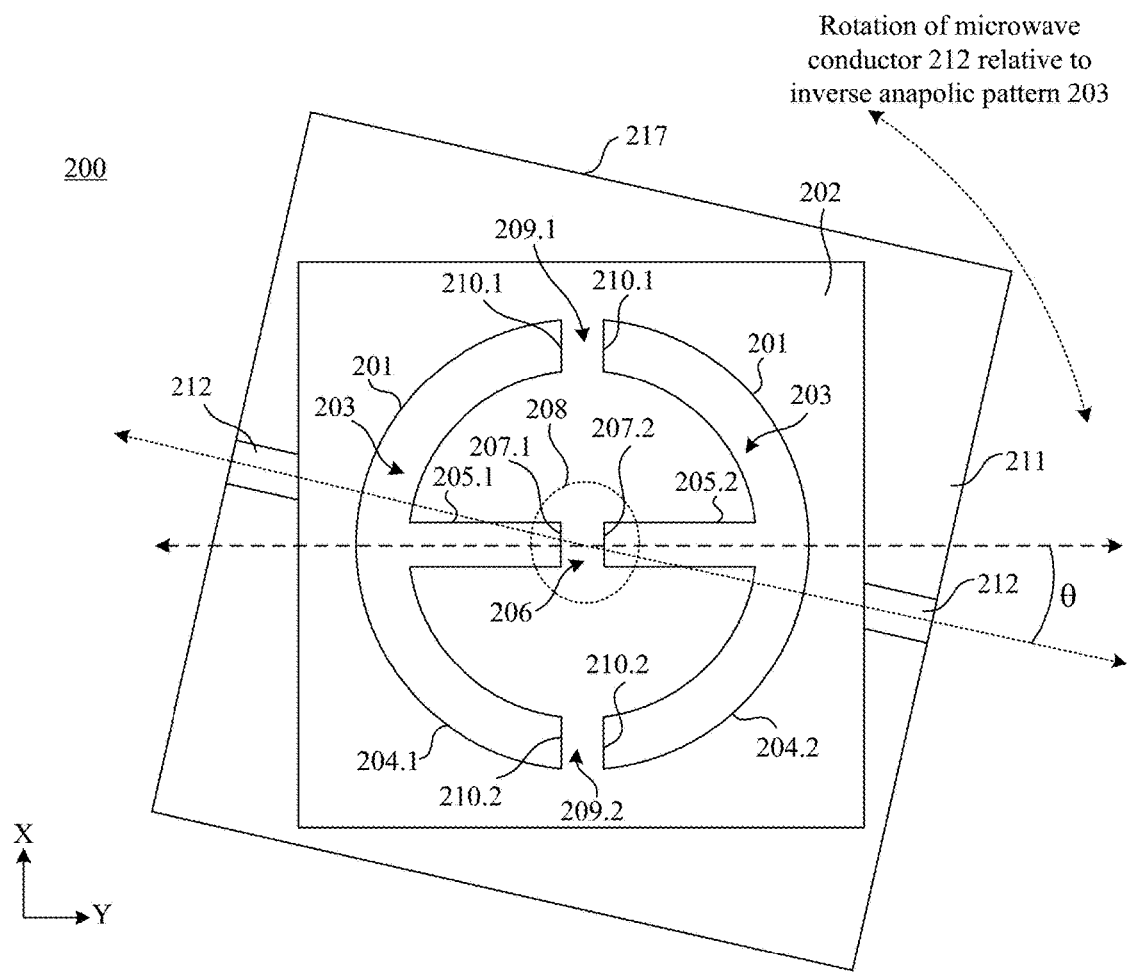
FIG. 3 shows mutual rotary motion of an anapolic conductor 202 and an inverse anapolic pattern relative to a microstrip of a planar inverse anapole microresonator.
Figure 4:
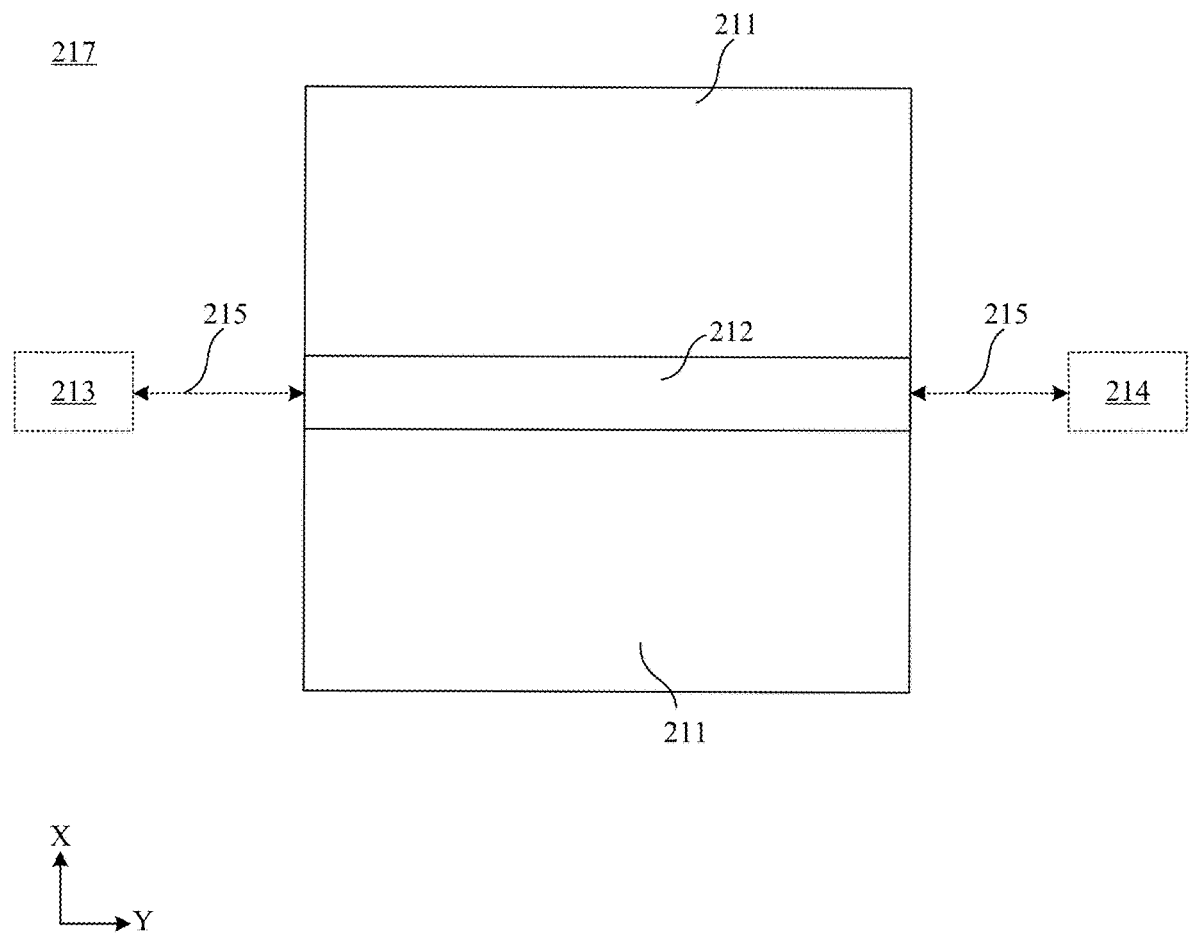
FIG. 4 shows a microstrip for microwave coupling to an anapolic conductor and an inverse anapolic pattern in a planar inverse anapole microresonator.

In an embodiment, with reference to FIG. 2, FIG. 3, and FIG. 4, planar inverse anapole microresonator 200 includes microstrip 217 on which anapolic substrate 201 is disposed, wherein anapolic substrate 201 is interposed between microstrip 217 and anapolic conductor 202.

In an embodiment, microstrip 217 includes dielectric substrate 211; and microwave conductor 212 that is disposed on dielectric substrate 211 and that receives microwave radiation 215 and communicates microwave radiation 215 to subject inverse anapolic pattern 203 to microwave radiation 215 and produce magnetic field region 208. In an embodiment, anapolic substrate 201 is adjustably disposed on microstrip 217 such that medial arm 205 of first inverse anapolic pattern 203.1 and medial arm 205 of second inverse anapolic pattern 203.1 are rotationally adjustable with respect to microwave conductor 212, as shown in FIG. 3 with coupling angle θ between medial arm 205 of first inverse anapolic pattern 203.1 and medial arm 205 of second inverse anapolic pattern 203.1 and microwave conductor 212. It is contemplated that coupling angle θ can be from 0° to 90°. In an embodiment, coupling angle θ is variable to obtain critical coupling of inverse anapole pattern 203 to microwave conductor 212 for CW operation of planar inverse anapole microresonator 200, and over-coupling of inverse anapolic pattern 203 to microwave conductor 212 for pulsed operation of planar inverse anapole microresonator 200.

In an embodiment, anapolic substrate 201 is adjustably disposed on microstrip 217 in the y-direction as shown in FIG. 2 to adjust the resonant frequency of inverse anapolic pattern 203 for operation of planar inverse anapole microresonator 200. It is contemplated that the y-distance on microstrip 217 is variable and can be from 10 mm to 7 mm.

Figure 22:
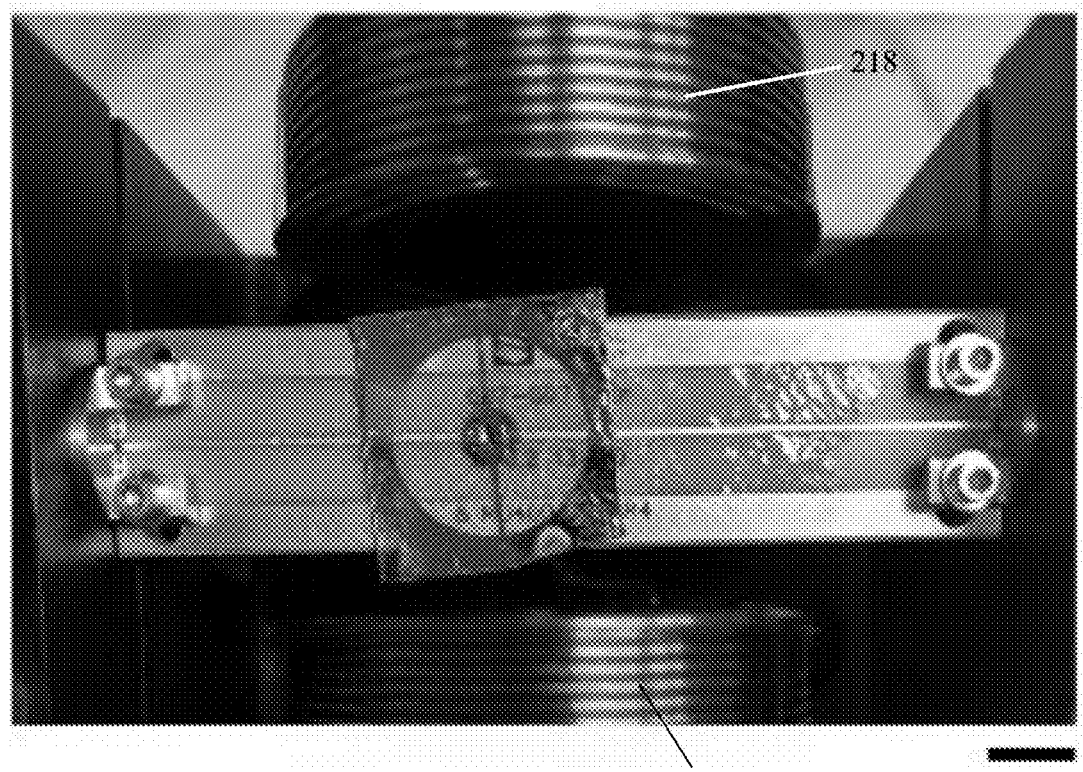
FIG. 22 shows (a) a plan view and (b) side view of a 10 GHz planar inverse anapole microresonator that substituted for the resonator and modulation coils in an EPR spectrometer. Scale bars represent 5 mm.
Figure 22:
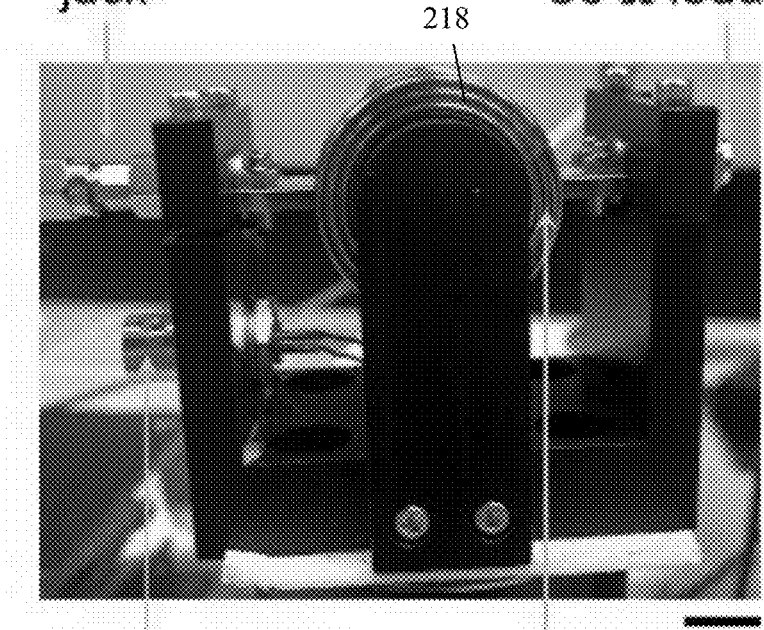
Figure 23:
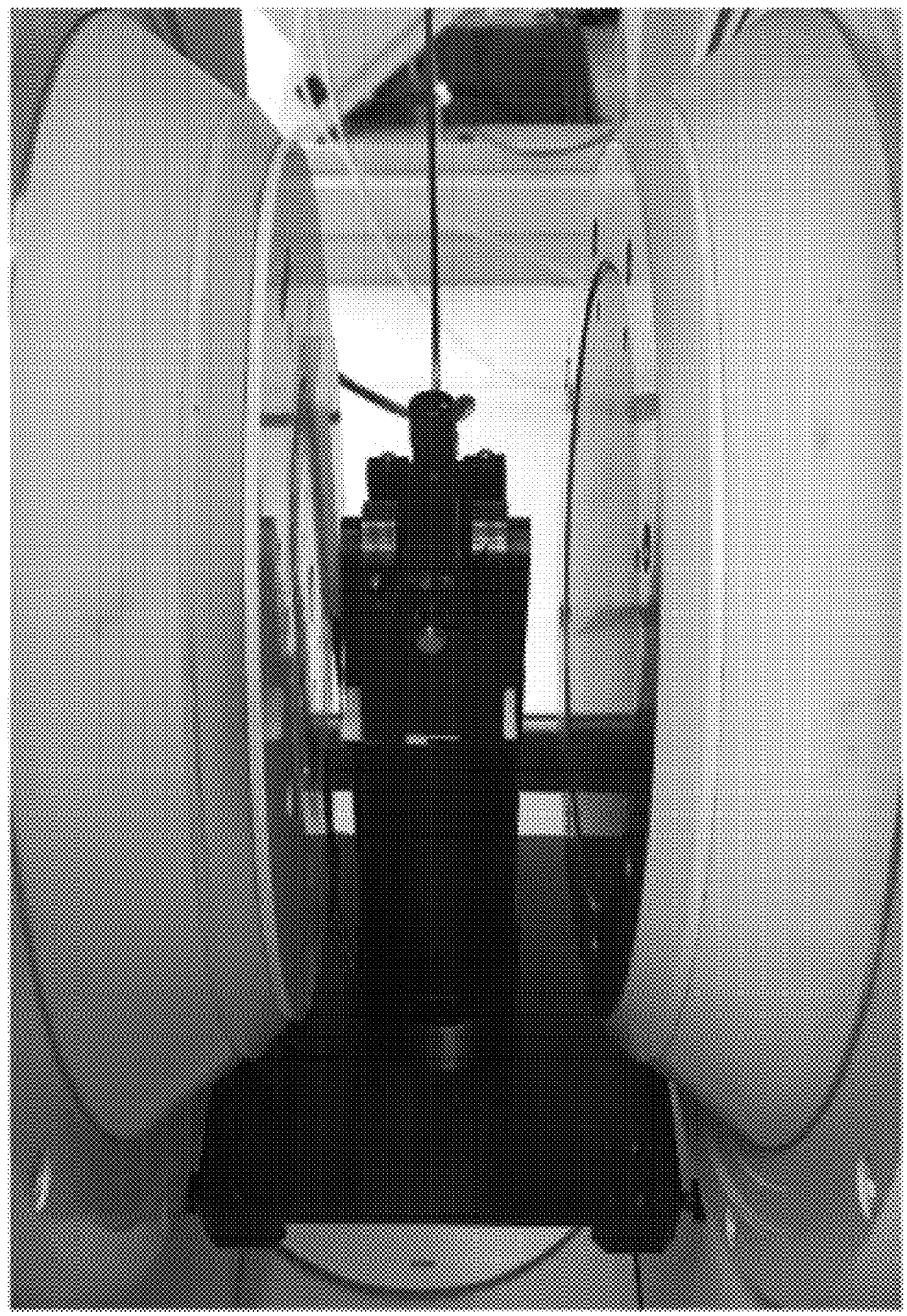
FIG. 23 shows a planar inverse anapole microresonator interposed between magnet poles of an electromagnet in an EPR spectrometer system.

In an embodiment, with reference to FIG. 22 and FIG. 23 planar inverse anapole microresonator 200 includes first modulation coil 218 and second modulation coil 218 between which is disposed inverse anapolic pattern 203. Terminator 214 can be disposed in communication with microwave conductor 212 to receive microwave radiation 215 from microwave conductor 212 for termination of the microwave line and reflection of microwave radiation 215, as shown in FIG. 4 and FIG. 22. Microwave source 213 can be in communication with microwave conductor 212 to produce microwave radiation 215 and communicate microwave radiation 215 to microwave conductor 212.

Planar inverse anapole microresonator 200 can be made from various elements and components. Anapolic substrate 201 can include a dielectric material that is transparent to microwave radiation for communication of microwave radiation 215 from microwave conductor 212 to anapolic conductor 202 so that magnetic field region 208 is formed by inverse anapolic pattern 203 in anapolic conductor 202. Exemplary materials for anapolic substrate 201 include ceramic, plastic, oxides of various metals, and the like.

Figure 12:
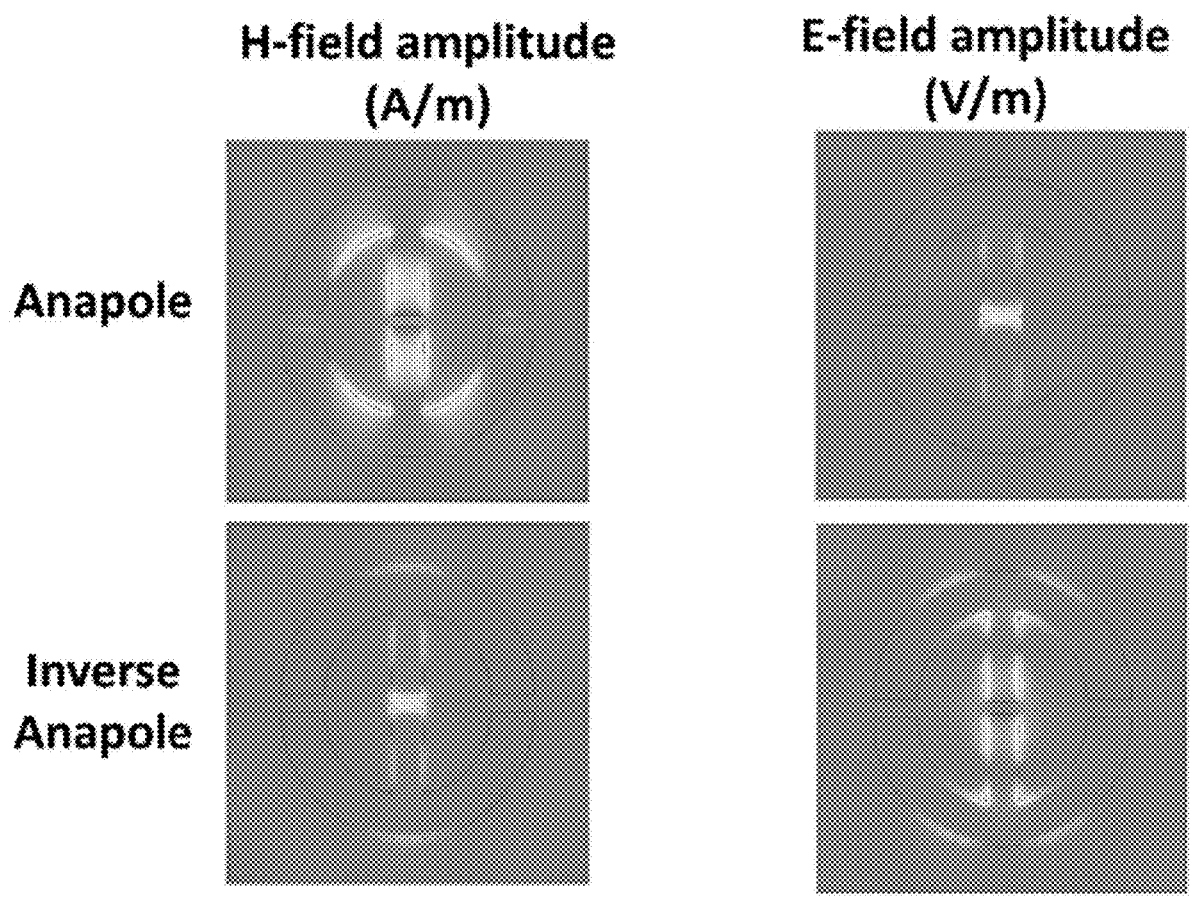
FIG. 12 shows complementary magnetic and electric field distributions in an anapole structure and an inverse anapole pattern.

Anapolic conductor 202 is diposed on anapolic substrate 201 for formation of inverse anapolic pattern 203 in inverse anapolic pattern 203 to provide an inverse anopolic structure that centurally concentrates magnetic field strength at magnetic field region 208 coincideent at central bridge 219. Anapolic conductor 202 can include electrically conductive materials such as conductively-doped polycrystalline silicon, a metal (e.g., copper, gold, and the like), tin-doped indium oxide, and the like. The conductive material can be selected to provide inverse anapolic pattern 203 by patterning such as performing etching or photolithography or machining such as cutting or oblation to form inverse anapolic pattern 203 from anapolic conductor 202. Inverse anapolic pattern 203 concentrates the magnetic field centrally within central bridge 219 as shown in FIG. 6f, FIG. 7, FIG. 10, and FIG. 12, Further, as shown in FIG. 12, it should be appreciated that an inverse anapole that concentrates the magnetic field centrally in a hotspot of magnetic field strength, and an anapole distributes magnetic field at other parts of a conductor instead of a central portion. That is, a maximum magnetic field strength for the inverse anapolic pattern is an inverse of that for an anapole structure.

Figure 16:
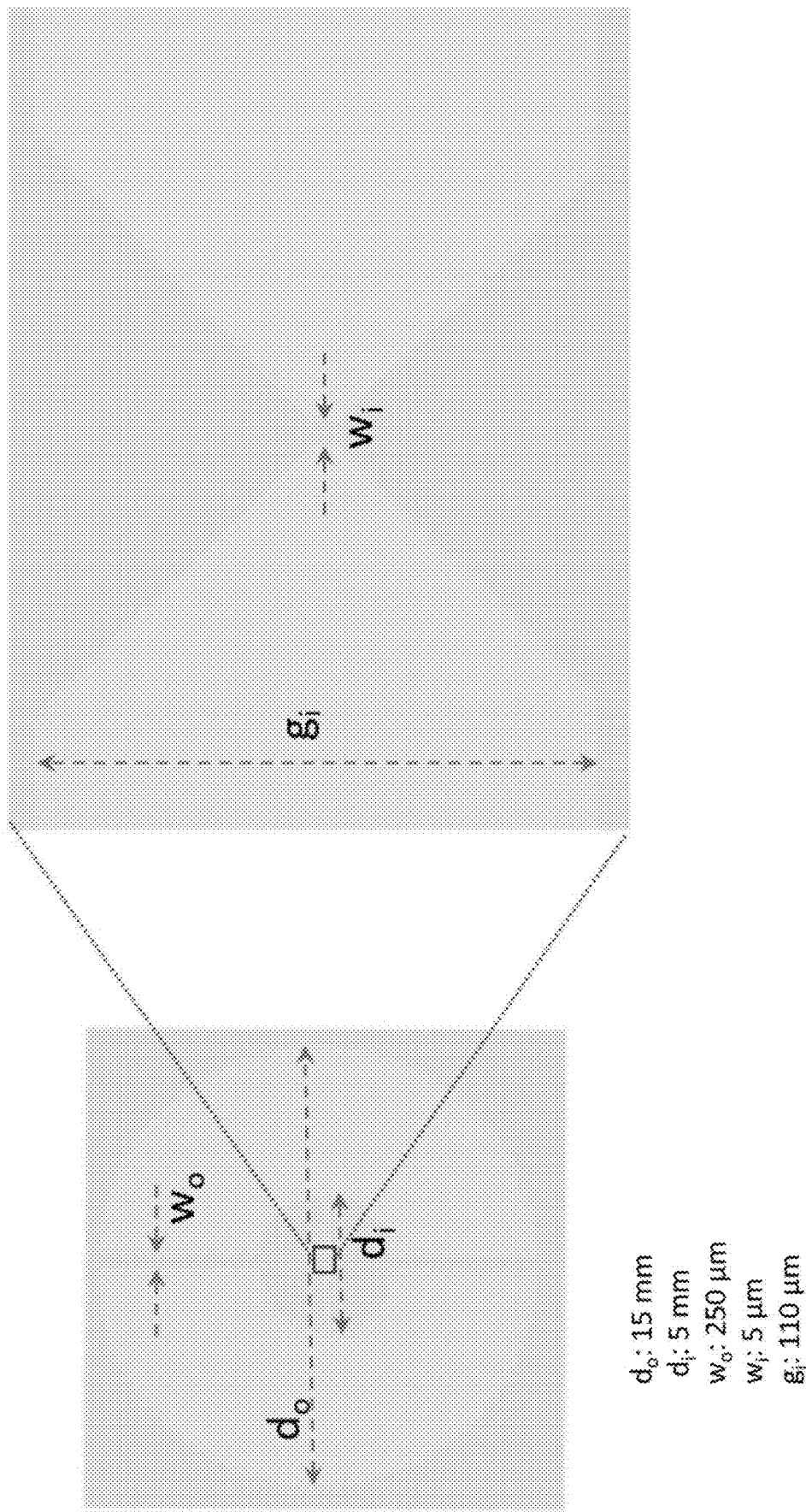
FIG. 16 shows a plan view of the microresonator surface, showing patterns and dimensions for a 10 GHz planar inverse anapole microresonator with an active volume of the magnetic field region of approximately 1 pL.

Inverse anapolic pattern 203 includes semi annular arms (204.1, 204.2) that oppose each other. Medial arm 205 extends radially from concave border 216 of semi annular arm 204 to medial tip 207 abutting central bridge 219 in interior plenum 221 of anapolic conductor 202 having medial gap 206. Opposing semi annular arms (204.1, 204.2) terminate at arm tendrils 210 spaced apart by arm gap 209. An interior of semi annular arm 204 has concave border 216 with a concave shape that borders interior plenum 221 of anapolic conductor 202. An exterior of semi annular arm 204 has convex border 223 with a convex shape that borders exterior plenum 222 of anapolic conductor 202. It should be appreciated that to produce the inverse anapole for concentrated, centralized magnetic field strength, anapolic conductor 202 is co-planar with inverse anapolic pattern 203. Medial gap 206 located at central bridge 219 of interior plenum 221 has a distance $w_i$ from a proximate portion of first medial tip 207.1 to second medial tip 207.2 that can be from 50 nanometers (nm) to 800 millimeters (mm), specifically from 100 nm to 100 mm, and more specifically from 10 micrometers (μm) to 1 mm. Medial tip 207 can have various shapes to provide localization of magnetic field region 208 as exemplified, but not limited by, FIG. 6b FIG. 7b, and FIG. 10. Various other size parameters of inverse anapolic pattern 203 are shown in FIG. 16. Outer distance $d_o$ from convex border 223 of first inverse anapolic pattern 203.1 to convex border 223 of second inverse anapolic pattern 204.1 can be from 50 nanometers (nm) to 800 millimeters (mm), specifically from 100 nm to 100 mm, and more specifically from 10 micrometers (μm) to 1 mm. Inner distance $d_i$ from concave border 216 of first inverse anapolic pattern 203.1 to concave border 216 of second inverse anapolic pattern 203.2 can be from 50 nanometers (nm) to 800 millimeters (mm), specifically from 100 nm to 100 mm, and more specifically from 10 micrometers (μm) to 1 mm. Distance $w_o$ of arm gap 209 between opposing arm tendrils 210 of first inverse anapolic pattern 203.1 and second inverse anapolic pattern 203.2 can be from 50 nanometers (nm) to 800 millimeters (mm), specifically from 100 nm to 100 mm, and more specifically from 10 micrometers (μm) to 1 mm. Further, medial arm 205 can have a transverse width gi that can be from 50 nanometers (nm) to 800 millimeters (mm), specifically from 100 nm to 100 mm, and more specifically from 10 micrometers (μm) to 1 mm. Thickness T of anapolic conductor 202 and inverse anapolic pattern 203 can be from 50 nanometers (nm) to 800 millimeters (mm), specifically from 100 nm to 100 mm, and more specifically from 200 nm to 2 μm.

To achieve concentration of the magnetic field in the magnetic field region 208 at central bridge 219, microwave conductor 212 receives microwave radiation 215 and subjects anapolic conductor 202 and inverse anapolic pattern 203 to microwave radiation 215. Microwave conductor 212 is an efficient conductor of microwave frequencies and is disposed on dielectric substrate 211. Dielectric substrate 211 electrically isolates microwave conductor 212 without interfering with communication of microwave radiation 215 in microwave conductor 212. Exemplary dielectric substrates include glass, ceramic, and the like. Exemplary microwave conductors include copper, silver, and the like. A frequency of the microwave radiation 215 can be from 1 gigahertz (GHz) to 100 GHz, specifically from 5 GHz to 50 GHz, and more specifically from 9 GHz to 34 GHz. A power of the microwave conductor 212 can be from 100 microwatts (μW) to 100 watts (W), specifically from 1 milliwatt (mW) to 50 W, and more specifically from 9 mW to 25 W.

Microwave source 213 produces microwave radiation 215 and communicates microwave radiation 215 to microwave conductor 212. Exemplary microwave sources 213 include a magnetron, klystron, traveling-wave tube, gyrotron, field-effect transistor, tunnel diode, Gunn diode, voltage-controlled oscillator, frequency synthesizer, and the like. In an embodiment, microwave source 213 is an EPR spectrometer microwave source.

An exposed surface, e.g., the top-most surface (with respect to the Z-axis shown in FIG. 1) of planar inverse anapole microresonator 200 that includes inverse anapolic pattern 203 and central bridge 219 as shown in FIG. 1 is configured to receive an analyte (also referred to herein as a sample) that is subjected to performing inductive-detection electron paramagnetic resonance spectroscopy by the magnetic field formed by anapolic conductor 202 and inverse anapolic pattern 203. The analyte can be an arbitrary analyte such as a fluid, including condensed and rarefied matter. The analyte provides an electron paramagnetic resonance signal in response to the magnetic field of planar inverse anapole microresonator 200. It is contemplated that the analyte can be anapolic substrate 201, wherein anapolic conductor 202 and inverse anapolic pattern 203 are disposed on the analyte. Exemplary analytes include biological tissues, liquids, small molecules, inorganic compounds, organic compounds, compositions, and the like. The volume of the sample disposed on magnetic field region 208 can be from 500 femtoliters (fL) to 500 nanoliters (nL), specifically from 1 picoliter (pL) to 1 nL, and mores specifically from 1 pL to 100 pL. It is contemplated that planar inverse anapole microresonator 200 has a spin detection limit from $1\times10^6$ $(\text{mT}\sqrt{\text{Hz}})^{-1}$ (i.e., $1\times10^5$ $(\text{G}\sqrt{\text{Hz}})^{-1}$) to $1\times10^{11}$ $(\text{mT}\sqrt{\text{Hz}})^{-1}$, specifically from $1\times10^7$ $(\text{mT}\sqrt{\text{Hz}})^{-1}$ to $1\times10^{10}$ $(\text{mT}\sqrt{\text{Hz}})^{-1}$, and more specifically from $7\times10^8$ $(\text{mT}\sqrt{\text{Hz}})^{-1}$ to $4\times10^9$ $(\text{mT}\sqrt{\text{Hz}})^{-1}$, based on microwave radiation 215 at 10 GHz with the analyte at room temperature. For CW microwave operation, anapolic conductor 202 and inverse anapolic pattern 203 can be impedance matched to microwave conductor 212 for critical coupling to attain a quality factor that can be from 1 to $10^9$, specifically from 100 to $10^5$, and more specifically from 200 to $10^3$.

Planar inverse anapole microresonator 200 can be made in various ways. It should be appreciated that planar inverse anapole microresonator 200 includes a number of optical, electrical, or mechanical components, wherein such components can be interconnected and placed in communication (e.g., optical communication, electrical communication, fluid communication, mechanical communication, and the like) by physical, chemical, optical, or free-space interconnects. The components can be disposed on mounts that can be disposed on a bulkhead for alignment or physical compartmentalization. As a result, planar inverse anapole microresonator 200 can be disposed in a terrestrial environment or space environment.

Planar inverse anapole microresonator 200 can be fabricated on anapolic substrate 201 composed of either lanthanum aluminum oxide (LAO) or lanthanum aluminate-strontium aluminum titanate (LSAT). The anapolic substrate 201 with a thickness of 500 μm and a dielectric constant of 22 to 25 was cleaned in piranha solution and then spin-coated with a photoresist (LOR 10 prebaked at 175° C. followed by SPR 220 prebaked at 115° C.). Planar inverse anapole microresonator 200 layout was patterned into the photoresist using an ultraviolet laser (375 nm at 300 mJ/cm$^2$). The resist was developed using MIF300. The surface of the coated anapolic substrate 201 was then cleaned by reactive ion etching with oxygen plasma. Next, the anapolic conductor 202 was created by deposition of a film of Ti (30 nm) then a film of Au (500 nm) over the patterned photoresist on anapolic substrate 201 using e-beam evaporation. Excess gold was removed by manual liftoff (soaked in a Remover 1165 overnight). A layer of silicon nitride (50 nm) was deposited on the x-y plane of planar inverse anapolic microresonator 200 using plasma-enhanced chemical vapor deposition.

In an embodiment, planar inverse anapole microresonator 200 was coupled to microwave conductor 212 on dielectric substrate 211. Planar inverse anapole microresonator 200 was adhered to microstrip 217 using a small amount of silicone grease. Planar inverse anapole microresonator 200 was critically coupled to the microwave radiation 215 propagating through microwave conductor 212 by adjusting the position of planar inverse anapole microresonator 200 relative to microwave conductor 212. The coupling angle θ and the x-position of planar inverse anapole microresonator 200 on microstrip 217 are adjusted to achieve the operation frequency and critical-coupling for CW or overcoupling for pulsed EPR spectroscopy operation. Terminator 214 on microstrip 217 was a 50-ohm load. Coupling was monitored using a network analyzer (VNA). Internal reflections from microwave source 213 were compensated for by one-port short-open-load calibration. The critically-coupled planar inverse anapole microresonator 200 adhered to microstrip 217 was disposed on a holder made of acrylonitrile butadiene styrene (ABS) for placement between the magnet poles of the EPR spectrometer system. A pair of commercial air-core inductor coils (modulation coils 218) provided static magnetic field modulation for CW EPR spectroscopy measurements. Modulation coils 218 were mounted on the ABS holder and connected to a modulation amplifier in either an EPR spectrometer system operating at 10 GHz or an EPR spectrometer system operating at 34 GHz. Microstrip 217 was connected to the spectrometer microwave source in each instrument using a coaxial cable matched to the EPR spectrometer operation frequency. To collect an absorption spectrum using the EPR spectrometer system operating at 10 GHz, the reference arm was kept on and the incident microwave frequency was locked at a value close to the critically-coupled frequency obtained by adjusting the position of planar inverse anapole microresonator 200 relative to microwave conductor 212 and observed on the VNA. The response of modulation coils 218 was matched to the modulation amplitude settings used by the EPR spectrometer. For CW operation with the NIST-built EPR spectrometer system, the critically-coupled frequency obtained by adjusting the position of planar inverse anapole microresonator 200 relative to microwave conductor 212 was provided by direct frequency adjustment and readout. The modulation amplitude produced by modulation coils 218 was determined by measurement of the linewidth of the EPR absorption line of a BDPA-benzene crystal.

Figure 5:
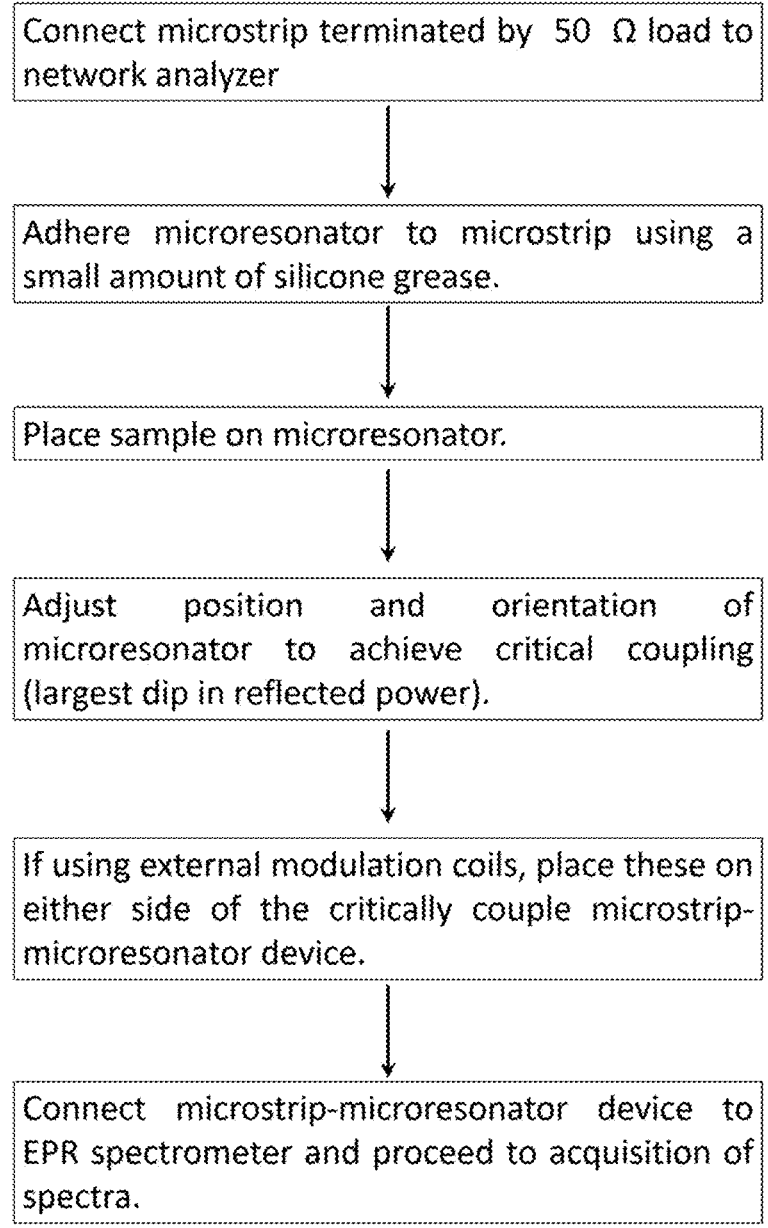
FIG. 5 shows a flow chart for performing inductive-detection electron paramagnetic resonance spectroscopy.

Planar inverse anapole microresonator 200 has numerous advantageous and unexpected benefits and uses. In an embodiment, with reference to FIG. 5, a process for performing inductive-detection electron paramagnetic resonance spectroscopy includes: communicating microwave radiation 215 through microwave conductor 212 by use of a coaxial cable; subjecting inverse anapolic pattern 203 in anapolic conductor 202 to microwave radiation 215 from microwave conductor 212 by positioning planar inverse anapole microresonator 200 relative to microwave conductor 212 to provide impedance matching (critical coupling for CW operation) or overcoupling (pulsed operation); and creating magnetic field region 208 and concentrating a magnetic field localized between medial tip 207.1 of first inverse anapolic pattern 203.1 and medial tip 207.2 of second inverse anapolic pattern 203.2 of inverse anapolic pattern 203 in response to subjecting inverse anapolic pattern 203 to microwave radiation 215 from microwave conductor 212 by use of a coaxial cable to perform inductive detection electron paramagnetic resonance spectroscopy.

In an embodiment, performing CW inductive-detection electron paramagnetic resonance spectroscopy includes disposing an analyte on anapolic conductor 202 in magnetic field region 208 by using a microscope to guide positioning of the sample; and subjecting the analyte to the magnetic field by placing the critically-coupled planar inverse anapole microresonator 200 on microstrip 217 between the magnet poles of an EPR spectrometer system, applying microwave radiation 215 and magnetic field modulation through modulation coils 218, and performing data collection via an EPR spectrometer system.

In an embodiment, performing pulsed inductive-detection electron paramagnetic resonance spectroscopy includes disposing an analyte on anapolic conductor 202 in magnetic field region 208 by using a microscope to guide positioning of the sample; and subjecting the analyte to the magnetic field by placing the overcoupled planar inverse anapole microresonator 200 on microstrip 217 between the magnet poles of an EPR spectrometer system, applying pulses of microwave radiation 215, and performing data collection via an EPR spectrometer system.

In an embodiment, performing CW inductive-detection electron paramagnetic resonance spectroscopy includes adjusting a position of inverse anapolic pattern 203 relative to microwave conductor 212 by manual adjustment aided by a magnifying device or microscope; and changing microwave coupling between inverse anapolic pattern 203 and microwave conductor 212 in response to adjusting the position of inverse anapolic pattern 203 relative to microwave conductor 212 by sequentially and manually adjusting coupling angle θ to produce the maximum absorbed microwave power as monitored on the VNA.

In an embodiment, performing pulsed inductive-detection electron paramagnetic resonance spectroscopy includes adjusting a position of inverse anapolic pattern 203 relative to microwave conductor 212 by manual adjustment aided by a magnifying device or microscope; and changing microwave coupling between inverse anapolic pattern 203 and microwave conductor 212 in response to adjusting the position of inverse anapolic pattern 203 relative to microwave conductor 212 by sequentially and manually adjusting coupling angle θ to overcouple planar inverse anapole microresonator 200 to microwave radiation 215.

In an embodiment, performing CW inductive-detection electron paramagnetic resonance spectroscopy includes subjecting the analyte to external radiation from modulation coils 218 by applying a current generated by an EPR spectrometer system to modulation coils 218.

In an embodiment, performing pulsed inductive-detection electron paramagnetic resonance spectroscopy includes subjecting the analyte to a sequence of 6 nanosecond (ns) to 1 millisecond (ms) pulses of microwave radiation with powers ranging from 1 W to 1 kW and a stationary magnetic field, both supplied by the EPR spectrometer system.

In an embodiment, performing CW inductive-detection electron paramagnetic resonance spectroscopy includes acquiring an electron paramagnetic resonance spectrum by detecting microwave radiation 215 that is reflected by terminator 214 connected to microwave conductor 212 after subjecting the analyte to a modulated magnetic field provided by modulation coils 218 and a swept magnetic field, both supplied by the EPR spectrometer system.

In an embodiment, performing pulsed inductive-detection electron paramagnetic resonance spectroscopy includes acquiring an electron paramagnetic resonance spectrum by detecting microwave radiation 215 that is reflected by terminator 214 connected to microwave conductor 212 after subjecting the analyte to a sequence of one or a series of 6 nanosecond (ns) to 1 millisecond (ms) pulses of microwave radiation with powers ranging from 1 W to 1 kW and a stationary magnetic field, both supplied by the EPR spectrometer system.

Planar inverse anapole microresonator 200 and processes disclosed herein have numerous beneficial uses, including room temperature measurements of dopants and defects in technologically-important thin film materials, rapid measurement of structure and dynamics of volume-limited or concentration-limited biomacromolecular systems, minimal variation in probed sample volume as a function of operation frequency, and facile integration with existing EPR spectrometer systems. Advantageously, planar inverse anapole microresonator 200 overcomes limitations of technical deficiencies of conventional compositions such as radiative loss (low quality factors) and impractical sample volumes at high operational frequencies.

Planar inverse anapole microresonator 200 provides inductive-detection of electron spins in picoliter volumes of a sample with increased sensitivity compared with conventional devices such as microresonators used for spin detection in volume-limited samples that suffer from poor quality-factors, which adversely affects sensitivity. Advantageously, planar inverse anapole microresonator 200 has an inverse anapole structure that produces toroidal moment and decreases radiative losses from the planar anapolic conductor 202 and inverse anapolic pattern 203 and simultaneously confines and centrally concentrates microwave magnetic fields in an picoliter volumes of magnetic field region 208 at central bridge 219. It should be appreciated that in view of the Babinet principle, inverse anapolic pattern 203 produces a magnetic field hotspot because of the planar inverse anapole pattern to accomplish inductive-detection electron magnetic resonance. High quality-factors enable facile coupling with a microwave feedline, allowing continuous wave EPR experiments not provided by conventional microresonator designs. The size of the hotspot provided by the active volume of anapolic conductor 202 and inverse anapolic pattern 203 is smaller than the overall dimensions of planar inverse anapole microresonator 200. This provides scalability to microwave frequencies, e.g., of greater than 100 GHz so that planar inverse anapole microresonator 200 can be scaled for use with multiple frequencies without sacrificing functionality, overcoming a technical limitation of conventional microresonator designs. High quality-factors of planar inverse anapole microresonator 200 provide easy coupling to microwave feedlines for deployment of planar inverse anapole microresonator 200 in spectrometers for measurement of picoliter-volume samples for absolute sensitivity that can be an order of magnitude higher than conventional microresonators.

Planar inverse anapole microresonator 200 and processes herein unexpectedly provide resonance frequency adjustment of inverse anapolic pattern 203 through varying the y-position of planar inverse anapole microresonator 200 along microwave conductor 212 on microstrip 217.

The articles and processes herein are illustrated further by the following Example, which is non-limiting.

EXAMPLE

Scalable microresonators for room-temperature detection of electron spin resonance from dilute, sub-nanoliter volume solids.

A planar inverse anapole microresonator provides room-temperature detection of electron spins in picoliter volumes that can include low levels of analytes, e.g., dopants in perovskite oxides. The planar inverse anapole microresonator exploits a toroidal moment in an inverse planar anapole from a monolithic inverse anapole metamaterial architecture to produce a microwave resonance exhibiting a spatially confined magnetic-field hotspot and simultaneously high quality factor (Q-factor). To demonstrate the broad array of implementations of the planar inverse anapole microresonator and its scalability to higher frequencies, the planar inverse anapole microresonator is disposed in an electron paramagnetic resonance (EPR) spectrometer operating at 10 GHz and a an EPR spectrometer operating at 35 GHz. We report continuous wave (CW) EPR spectra for various samples, including a dilute $Mn^{2+}$-doped perovskite oxide, $CaTiO_3$, and a transition metal complex, $CuCl_2.2H_2O$. The planar inverse anapole microresonator provides multifrequency EPR characterization of dopants and defects in perovskite oxide microcrystals and other volume-limited materials of technological importance.

Spin detection in volume-limited samples has applications in fields ranging from solid-state physics to structural biology. Magnetic resonance spectroscopies based on inductive detection are powerful and versatile techniques that can provide atomic-level structural and functional information for a wide range of samples under broadly variable conditions. However, conventional instrumentation is not sensitive enough to detect a large fraction of relevant volume-limited samples (<10 pL), which are often dilute doped samples with broad lines and concentrations <1 mole %, resulting in fewer than $10^8$ spins per picoliter. For example, electron paramagnetic resonance (EPR) spectroscopy is a widely used technique to characterize atomic environments of dopants and defects in technologically relevant materials, that are often studied in their polycrystalline form because of the difficulty of growing single crystals. Single crystallites of perovskite oxides typically have micro- to nano-scale dimensions and volumes ranging from pico- to nano-liters. The perovskite complex oxide has a crystal structure that, due its chemical tunability, is suited for a wide variety of technical and multi-functional applications. Depending on a number of crystal chemistry considerations that include but are not limited to stoichiometry, layering, cation ordering, and defect chemistry, the material can be designed for piezoelectric, insulating, catalytic, superconducting, and capacitive uses. Simple perovskite chemistries like $SrTiO_3$ or $CaTiO_3$ have limited use in commercial applications; however, these compositions serve as important model systems in which a multitude of fundamental studies are conducted. The study of point defects in these model systems helps facilitate metrology of defect chemistry in a broad range of technical ceramics.

Figure 6:
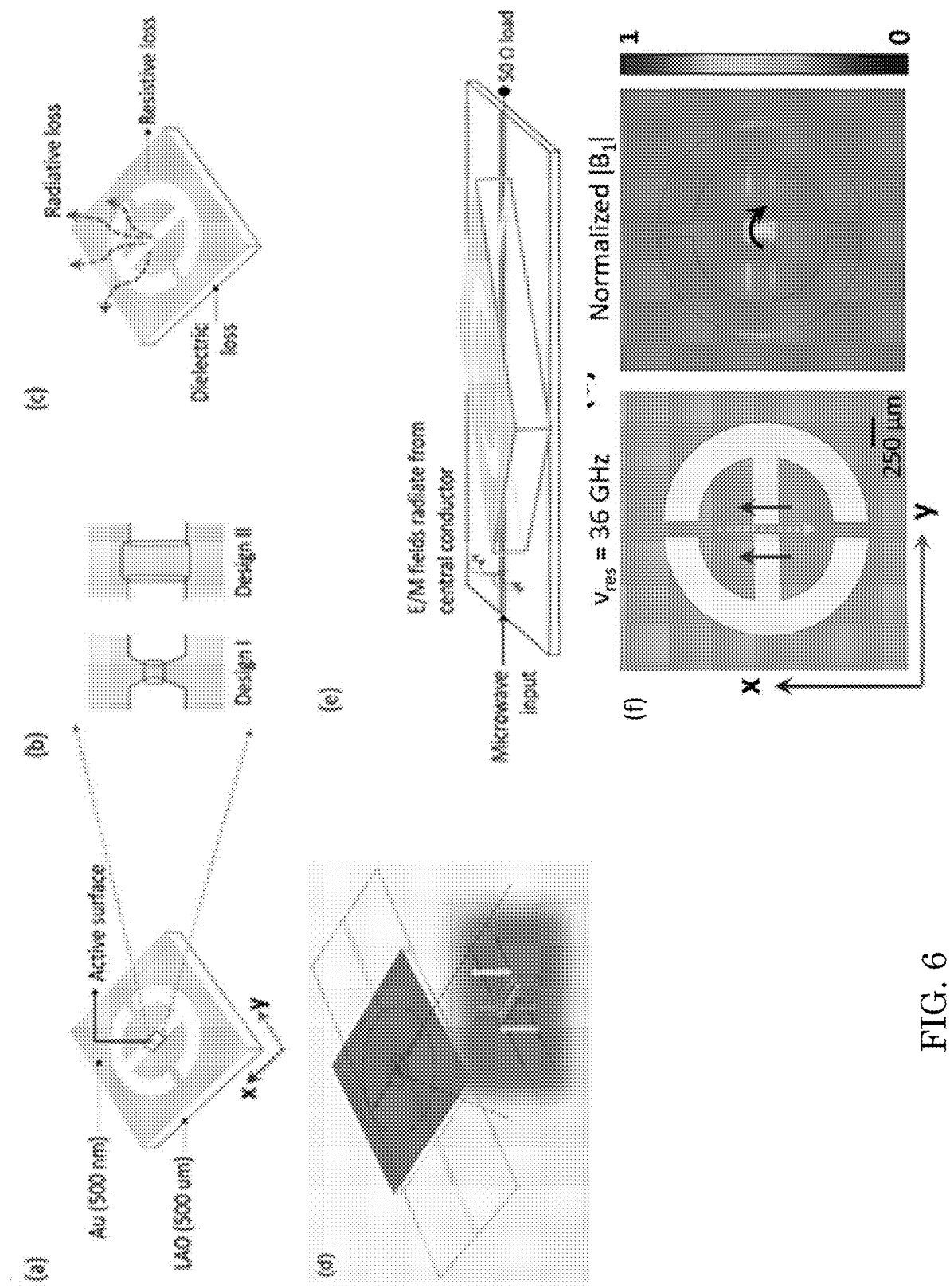
FIG. 6 shows various views of a planar inverse anapole microresonator. (a) Perspective view of the planar inverse anapole resonator including a dielectric substrate whose top surface is coated with a gold film. The central portion, indicated by the enlarged view in panel b, is where the microwave magnetic field is concentrated around the central bridge between the medial arms of the inverse anapolic patterns. (b) Two designs of the central bridge, providing active volumes of 1 picoliter (pL) (Design I) and 100 pL (Design II). (c) Types of power losses occurring from a planar inverse anapole microresonator. (d) Schematic of currents (arrows in plane with inverse anapolic patterns) and dipoles in the planar inverse anapole microresonator. The zoomed region shows the central bridge, where the magnetic flux density $B_1$ is concentrated. The in-plane arrows indicate the directions of currents flowing through and adjacent to the central bridge. Current through the central bridge results in a magnetic dipole in and out of the plane of the planar inverse anapole microresonator. The currents flowing through the inverse anapolic pattern adjacent to the central bridge provide a degenerate toroidal moment that is directed into and out of the plane. (e) Planar inverse anapole microresonator coupled to electromagnetic fields radiating from the central microwave conductor of the microstrip. (f) Plan view of exposed surface of the planar inverse anapole microresonator. In the left panel, the solid arrows indicate the electric dipole moment, and the dashed arrow indicates the toroidal moment. The right panel shows a simulation of the microwave magnetic flux density $B_1$ concentrated in a small volume in the magnetic field region at the central bridge and directed perpendicular to the current flowing through the central bridge, wherein the curved arrow shows the dominant direction of $B_1$.
Figure 7:
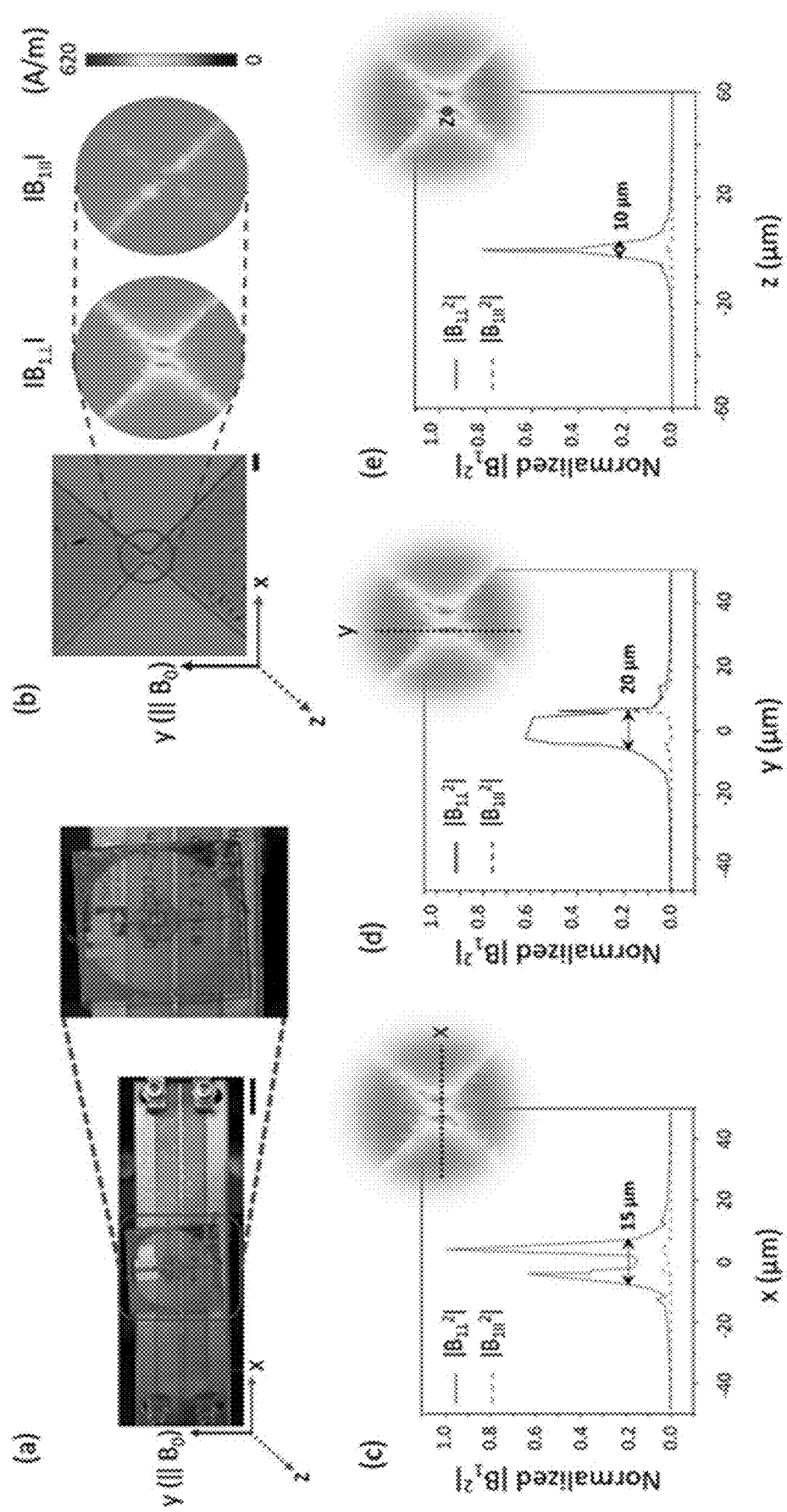
FIG. 7 shows a planar inverse anapole microresonator configured for operation at 10 GHz with a finite element simulation of the magnetic field region as an active volume of the planar inverse anapole microresonator. (a) Top view of a planar inverse anapole microresonator with a resonant frequency of 9.7 GHz. Scale bar=5 mm. A zoomed region in the panel on the right shows the microresonator chip. The outline portion at the center of the right panel encloses the magnetic field region as the magnetic field region of the planar inverse anapole microresonator. (b) The left panel shows a zoomed-in optical micrograph of the magnetic field region magnetic field region (Design I) of the planar inverse anapole microresonator. Scale bar=10 µm. The panels to the right of the optical micrograph show simulated distributions of perpendicular ($B_{1\perp}$) and tangential ($B_{1\parallel}$) components of the microwave magnetic flux density $B_1$ in the x-y plane, showing the central $B_{1\perp}$ 'hotspot'. (c, d, e): Normalized absolute values of simulated $B_{1\perp}^2$ (solid lines) and $B_{1\parallel}^2$ (dashed lines) along the x, y, and z co-ordinates. The dotted lines in the insets are the cut lines along which the field is plotted (z is perpendicular to the plane of the planar inverse anapole microresonator). An input voltage of 1 V and impedance of 50Ω was set in the finite element simulations, resulting in an input power of 20 mW.

The defect chemistry of a material can have a controlling effect on its resulting functional properties. The use of single crystals in EPR spectroscopy can yield orientational dependences of spin Hamiltonian parameters, allowing characterization of the substitutional properties of dopants. Rigorous characterization of the site of substitution, valence state, and nature of defect-complex formation is necessary to explain the effect of a dopant ion on the resulting physical properties of a material. Critical information about anisotropies is masked by the superposition of EPR spectra from a distribution of orientations in polycrystalline materials. Despite the clear advantage of studying single crystals, sufficiently large (several μL for conventional resonators) single crystals of dilute doped oxides are difficult to synthesize. Typical crystallite volumes are smaller than 1 pL, often approaching only 1 fL. To conduct routine inductive-detection EPR spectroscopy on single microcrystals of dilute doped oxides with sub-nanoliter volumes, it is necessary to develop resonators that have active volumes approaching 1 pL. Such resonators must couple easily to microwave feedlines and must be scalable to higher frequencies. It is also advantageous if they can be deployed in various spectrometers without the need for customized hardware. We note that alternate spin detection techniques can provide ultrahigh sensitivities; for example, pulsed electrically detected magnetic resonance (pEDMR) can provide detection limits of a few hundred spins, while optically detected magnetic resonance (ODMR) and magnetic resonance force microscopy (MRFM), can provide sensitivities down to the single-spin limit. However, these methods cannot provide the same depth of spectroscopic information provided by inductive-detection EPR spectroscopy. Sensitivities down to 1000 spins/$\sqrt{Hz}$ have been reported for inductive detection using superconducting microresonators. However, such devices also require highly restrictive experimental conditions, including cryogenic temperatures, low magnetic fields, and exotic detection circuitry such as Josephson parametric amplifiers. Given that conventional instrumentation in many laboratories relies on spectrometers built to measure spins using inductive detection, increasing the sensitivity of inductive detection for a broad range of experimental conditions extends the power of magnetic resonance spectroscopies to nanoscale samples. The planar inverse anapole microresonator for EPR spectroscopy uses a single unit of a planar inverse anapole metamaterial architecture with a toroidal moment to increase the quality-factor (Q-factor) and confine the spatial extent of the electromagnetic field (FIG. 6). We exploit the duality of electric and magnetic fields that are consistent with Babinet's principle with an inverse anapole pattern that efficiently confines microwave magnetic fields within a picoliter-scale volume at the center of the resonator. The active volume of the planar inverse anapole microresonator provides high Q-factors and a geometry that allows easy coupling to an external microwave feedline. The planar inverse anapole microresonator was disposed in an EPR spectrometer operating at 10 GHz and another EPR spectrometer operating at 35 GHz to obtain room-temperature continuous wave (CW) EPR spectra of various materials, including a dilute (<0.05 mole %) $Mn^{2+}$-doped sample of $CaTiO_3$ and a transition metal complex, $CuCl_2.2H_2O$.

Compared to conventional cavities, the miniaturized active volumes of the planar inverse anapole microresonator provide improved detection limits. Non-resonant scanning probes and microresonators have been designed and demonstrated as planar metallic structures patterned on dielectric substrates. Such structures can be readily fabricated using standard photolithographic techniques, yielding nanoliter active volumes in micrometer-scale resonators. The effect of such miniaturization on sensitivity can be explained in terms of two main resonator characteristics: the filling factor and the Q-factor. The filling factor can be roughly described as the fraction of the active volume of the resonator to the volume occupied by the sample. When the active volume becomes comparable to the sample volume, there is a gain of several orders of magnitude in the filling factor (compared to conventional cavity resonators) and a corresponding gain in absolute sensitivity.

Compared to cavity resonators, power losses are higher in open resonant structures such as loop-gap resonators and microstrip-based structures. The lossy nature of microresonators increases the difficulty of coupling with a microwave source such as a microstrip. Additionally, the size mismatch between microresonators and microstrips results in further inefficiency of coupling. Thus, decrease in Q-factor deteriorates both absolute sensitivity and concentration sensitivity. To increase the Q-factor, power losses must be decreased (FIG. 6c). The Q-factor is dependent on the combination of three types of losses: dielectric losses from the substrate, conductive losses from the metal, and radiative losses from the microstrip structure. Dielectric power loss is inversely proportional to the loss tangent of the substrate, and can be decreased using a low-loss dielectric substrate. Resistive power loss can be decreased by operating at lower temperatures, which is a commonly adopted strategy to increase Q-factors of small-volume planar resonators. Here we minimize radiative loss to increase the Q-factor of microresonators at room temperature, while confining the microwave excitation field within a volume about 1 pL to 10 pL. It should be noted that radiation shields can be used to decrease radiative losses from open resonant structures. This approach can provide Q-factor improvements of up to 50%. In comparison, the microresonator design reported here decreases radiation losses intrinsic to the resonator, improving the Q-factor by an order of magnitude compared to microresonators reported previously. Using this approach, we report an upper spin detection limit of $(7\pm2\times10^8)/\text{mT}\sqrt{\text{Hz}}$ in a volume of approximately 100 pL at room temperature. The sensitivity gains at lower temperatures are expected to be correspondingly higher.

Figure 13:
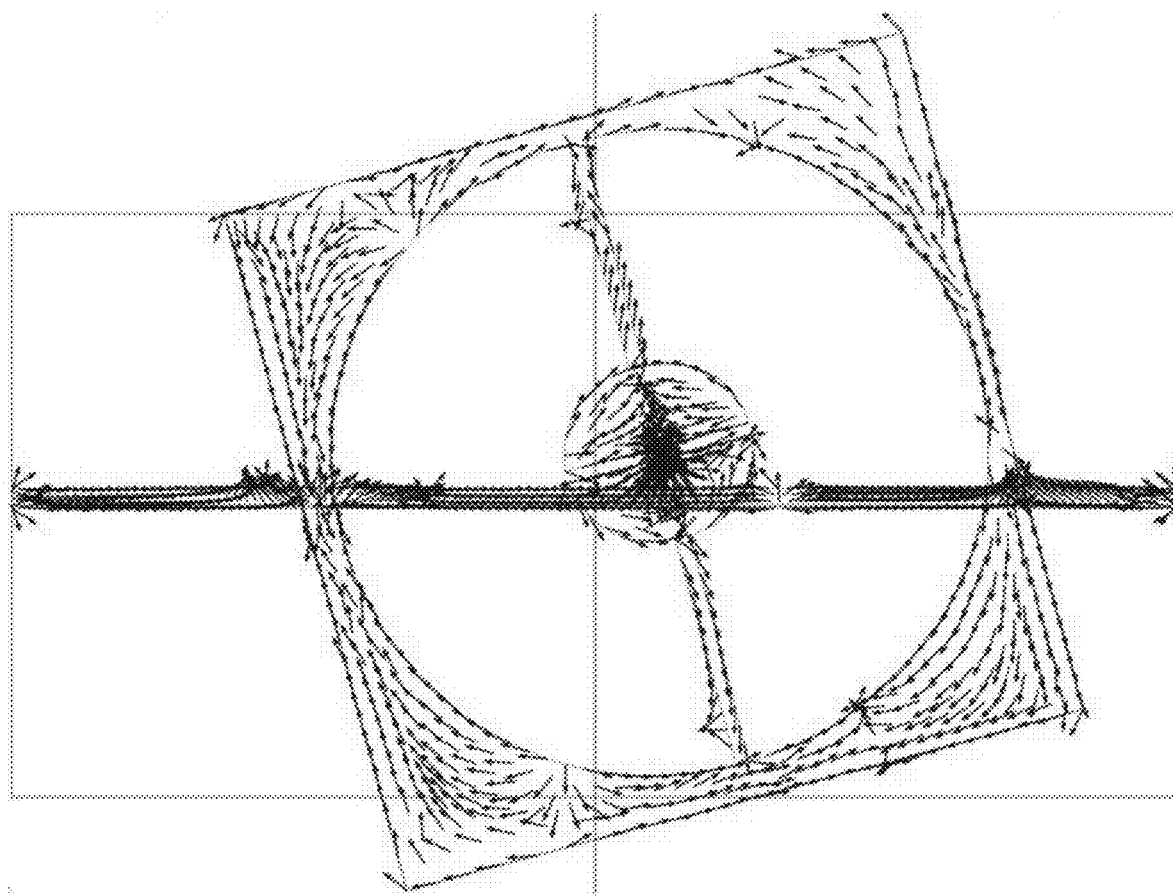
FIG. 13 shows current flow in a coupled microstrip-microresonator device operating at 10 GHz.
Figure 14:
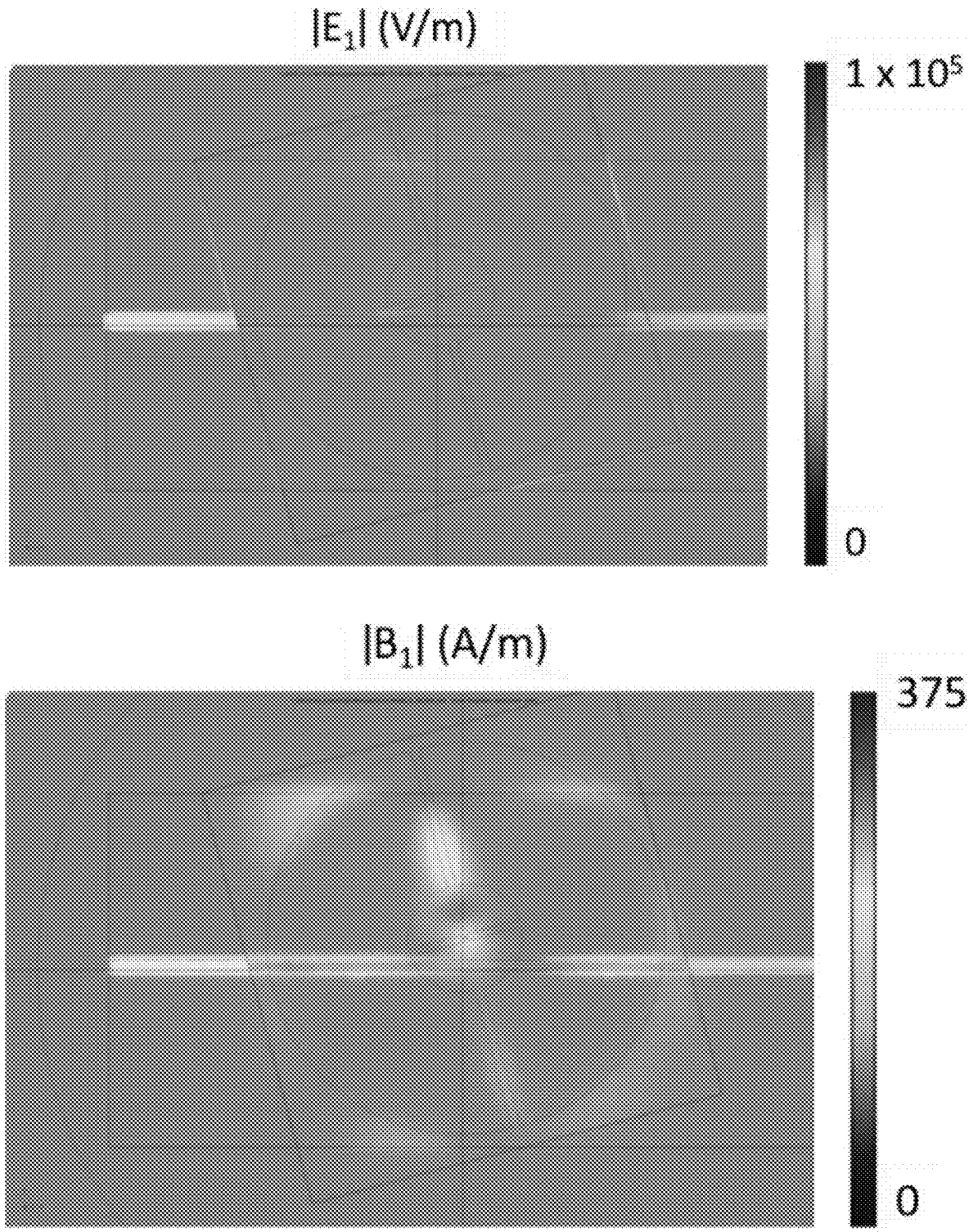
FIG. 14 shows field distributions in the plane of the microstrip with fringing fields from the microstrip that extend for much shorter length scales compared to the outer dimensions of the microresonator.

The reduction in radiation losses, resulting in high Q-factors of anapole resonators, is due to diminished far-field radiation because of destructive interference between toroidal and electrical dipole moments. Arrays of such resonators with toroidal moments can produce Q-factors as high as $10^5$. This approach cannot be directly applied to resonators for EPR spectroscopy because of the following additional considerations: (i) for sensitive measurements of the reflected power, the resonator must be critically coupled to a microwave source, (ii) there must be a sample volume where the microwave magnetic field $B_1$ is perpendicular to the static magnetic field $B_0$ (for perpendicular mode measurements) and (iii) the microwave electric field must be minimized in the active volume to avoid dielectric losses from lossy samples such as aqueous solutions. With these considerations in mind, the planar inverse anapole microresonator uses a complementary or inverse anapole structure. Previously investigated anapole resonators typically feature mostly-bare substrates with regions of patterned metals and microscale gaps where the electric field is concentrated. In contrast, we exploited the duality of electric and magnetic fields to design an inverse, mostly-metallized structure with a central bridging strip that supports a magnetic field 'hotspot' at the center of the resonator (FIG. 6a). We have simulated both anapole and inverse anapole resonators to verify their complementarity (see FIG. 12 of Supporting Information.). In the case of a regular anapole design, the electric dipole is formed in the central gap in the split ring, and the resulting circulating magnetic field (in the air gaps) generates the toroidal moment that is anti-parallel to the electric dipole. In the complementary or inverse architecture, an in/out of plane magnetic dipole forms around the top and bottom of the central metal notch (the short). On the other hand, the electrical field-driven circulating currents around the etched parts result in a net toroidal moment that is also in/out of plane—anti-parallel and degenerate with the magnetic dipole. A simplified picture of the current flow on the resonator surface is shown in FIG. 6d. The current distribution in the microstrip-microresonator device is more complicated (see FIG. 13). In the ideal inverted structure, the metal plane should be infinite while in the resonator, it is truncated at the edges. We conducted simulations to test the effect of this truncation on the inverse anapole mode, wherein Table 1 lists a dependence of eigenfrequency of anapole mode on outer length of metal plane. Increasing the outer length of the metal rectangle from 12 mm to 15 mm changes the resonant frequency and loss factor (imaginary component of eigenmode) by less than 10%. We surmise that the structure approximates an ideal inverted structure for two reasons: (i) Fringing fields from the microstrip extend for a length much smaller than the length of the microresonator (see FIG. 14), and (ii) the outer length of the metal layer is much larger than the coupling structure (the capacitive gaps) and the central bridge.

TABLE 1

| Edge length (mm) | Eigenfrequency of anapole mode | $B_1$ maximum at hotspot (A/m) |
| --- | --- | --- |
| 12 | 9.86 + 0.18i | $9 \times 10^4$ |
| 12.5 | 9.77 + 0.18 i | $8 \times 10^4$ |
| 13 | 9.69 + 0.18i | $8 \times 10^4$ |
| 13.5 | 9.62 + 0.19i | $8 \times 10^4$ |
| 14 | 9.53 + 0.21i | $8 \times 10^4$ |
| 14.5 | 9.42 + 0.24i | $7 \times 10^4$ |
| 15 | 9.27 + 0.27i | $6 \times 10^4$ |

This structure was fabricated on a low-loss dielectric (either lanthanum aluminate, LAO, or lanthanum strontium titanite, LSAT) to minimize dielectric losses from the resonator. The dielectric permittivities of LAO and LSAT vary in the ranges of 23.6 to 24.0 and 22.7 to 22.9, respectively, in the temperature range 2 K to 300 K. In this temperature range, the loss tangents of LAO and LSAT vary in the ranges of $1\times10^{-6}$ to $2\times10^{-5}$ and $1\times10^{-4}$ to $6\times10^{-4}$, respectively. Finite element simulations indicate that the variation in dielectric permittivity is expected to result in a variation of <0.5 GHz in the resonance frequency of the device, shifting it from 9.7 GHz to 9.3 GHz. The observed frequency varies in the range of 9.2 GHz to 9.8 GHz, depending on the x-position of the microresonator on the microstrip so that the decrease in frequency caused by low temperature may be compensated for by changing the position of the microresonator on the microstrip.

Planar inverse anapole microresonators were made with two types of bridges. In Design I, the bridge is cinched at the center to obtain a smaller active surface. In Design II, the bridge is a straight line that results in a large active surface. Design I results in an active volume of approximately 1 pL and also decreases the active height to <5 um. Design II results in an active volume of approximately 100 pL. Smaller active volumes and active heights are advantageous for samples such as microcrystals or thin films, in which it is desirable to restrict the microwave power to the epitaxial film so that it can be selectively probed without interference from the substrate. In this paper, we report the use of Design I for demonstration at 10 GHz and Design II at 35 GHz. This choice was arbitrary since either design can be applied at either frequency.

Lack of scalability to higher frequencies is a limitation of conventional devices that is overcome by the planar inverse anapole microresonator. Higher-frequency EPR studies can provide greater sensitivity and resolution, potentially providing spectral information not available at lower frequencies. Additionally, multi-frequency EPR can be used to separate field-dependent and field-independent components of the EPR spectrum. However, some conventional microresonator designs, such as those based on loop-gap architectures, become impractically small at higher frequencies. In contrast, the large overall size of the planar inverse anapole resonator enables scaling to higher frequencies without sacrificing the active volume or ease of coupling to a microwave source. Thus, this design overcomes the challenges of ring or loop-gap microresonators, which become difficult to fabricate and couple to microwave sources owing to progressively small radii with increasing frequency. The scalability of the anapole architecture can enable high-frequency EPR studies for volume-limited samples.

In both bridge designs, the microwave magnetic field $B_1$ is concentrated in a small volume around the central bridge and is directed perpendicular to the flow of current (right panel of FIG. 6). Below we show that the experimental Q-factors for these structures are in the approximate range of 250 to 350 at both 10 GHz and 35 GHz. Important advantages of this design include the picoliter active volume, ease of coupling to a microwave feedline and scalability to higher frequencies. Finally, we demonstrate that these devices can be integrated into existing EPR spectrometers for wide implementation.

Figure 15:
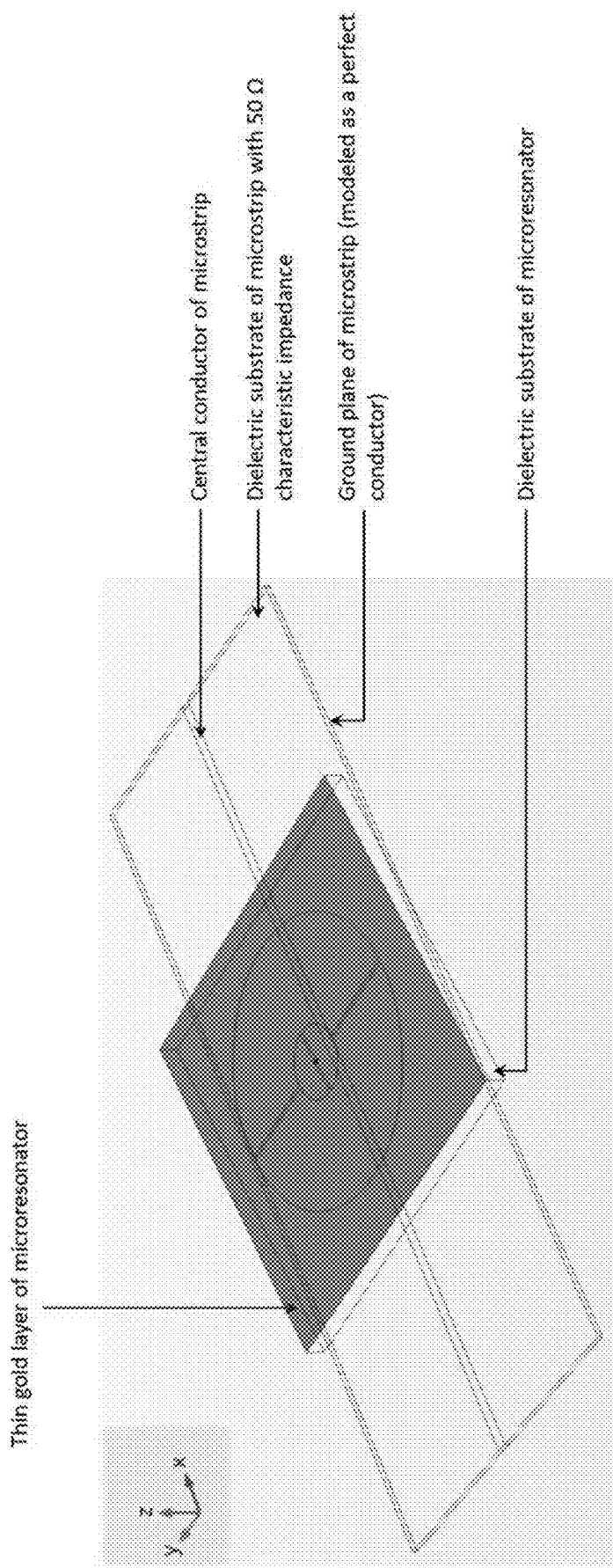
FIG. 15 shows a model of a planar inverse anapole microresonator used in finite element simulations. The scale bar represents 5 mm. The microstrip, with a characteristic impedance of 50Ω, radiates microwave fields owing to currents in the central conductor. The coupling of these fields with the microresonator is dependent on the position of the microresonator relative to the central conductor of the microstrip. In the finite element simulations, the length of the microstrip ranged from 20 mm to 50 mm while the real microstrip has a length of 50 mm. Smaller lengths were used in the finite element calculation to reduce computational time.

The planar inverse anapole microresonators were fabricated by patterning gold films of thickness 500 nm on either lanthanum aluminate (LAO) or lanthanum aluminate-strontium titanate (LSAT) substrates (dielectric constants ranging from 22 to 25) with thicknesses of 500 μm. Simulations of field distributions of the devices were conducted using the commercial finite element analysis software COMSOL. The complete finite element model of the planar inverse anapole resonator with dimensions is shown in FIG. 15. FIG. 16 provides dimensions of features of the metallized layer.

Figure 17:
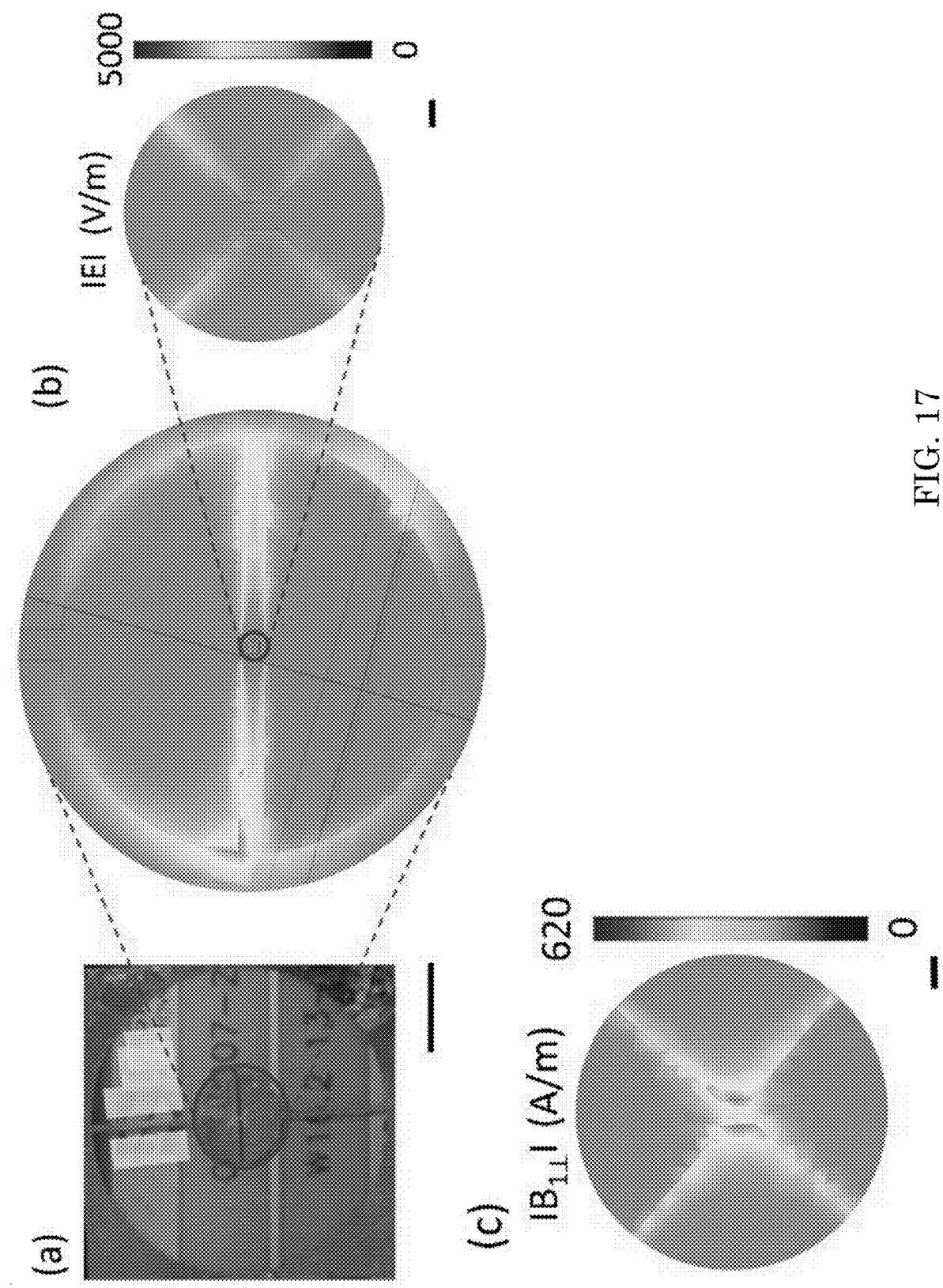
FIG. 17 shows (a) plan view of the microresonator coupled to microstrip for a planar inverse anapole microresonator. The scale bar indicates 3 mm. (b) Simulated electric field distribution, showing that the electric field is concentrated at the edges of the central capacitive gaps, as shown in the left panel. The right panel shows a zoomed-in view of the magnetic field region. (c) Simulated magnetic field distribution at the magnetic field region. A comparison of the right panel of (b) and (c) shows the separation between regions of magnetic and electric field. Electric field in the magnetic field region is negligible. The scale bars in (b) and (c) represent 10 µm.

With regard to simulation and experimental verification of the active volume, FIG. 7a the planar inverse anapole microresonator coupled to a microstrip that is connected to the microwave source of an EPR spectrometer system via a coaxial cable. The resonator was designed to exhibit a high-Q anapole mode at 10 GHz. The left panel of FIG. 7b shows a micrograph of the magnetic field region of the microresonator based on Design I, while the right panel shows finite element simulations of the distribution of the perpendicular ($B_{1\perp}$) and tangential ($B_{1\parallel}$) components of the microwave magnetic field in the magnetic field region. $B_{1\perp}$ is the sum of components of $B_1$ that are perpendicular to the static magnetic field $B_0$. Here $B_i$ is designated as the absolute value of $\sqrt{(B_{1x}^2+B_{1z}^2)}$, with $B_0$ applied along the y axis. Thus, $\sqrt{B_{1y}^2}$ is the absolute value of the tangential component of the microwave magnetic field. The EPR signal is directly proportional to $B_{1\perp}^2$. FIG. 17 shows that the electric field is concentrated at the edges of the capacitive gaps and is well-separated from the magnetic field region at the center of the resonator. This separation of electric and magnetic fields is particularly advantageous for samples with high dielectric losses.

Figure 8:
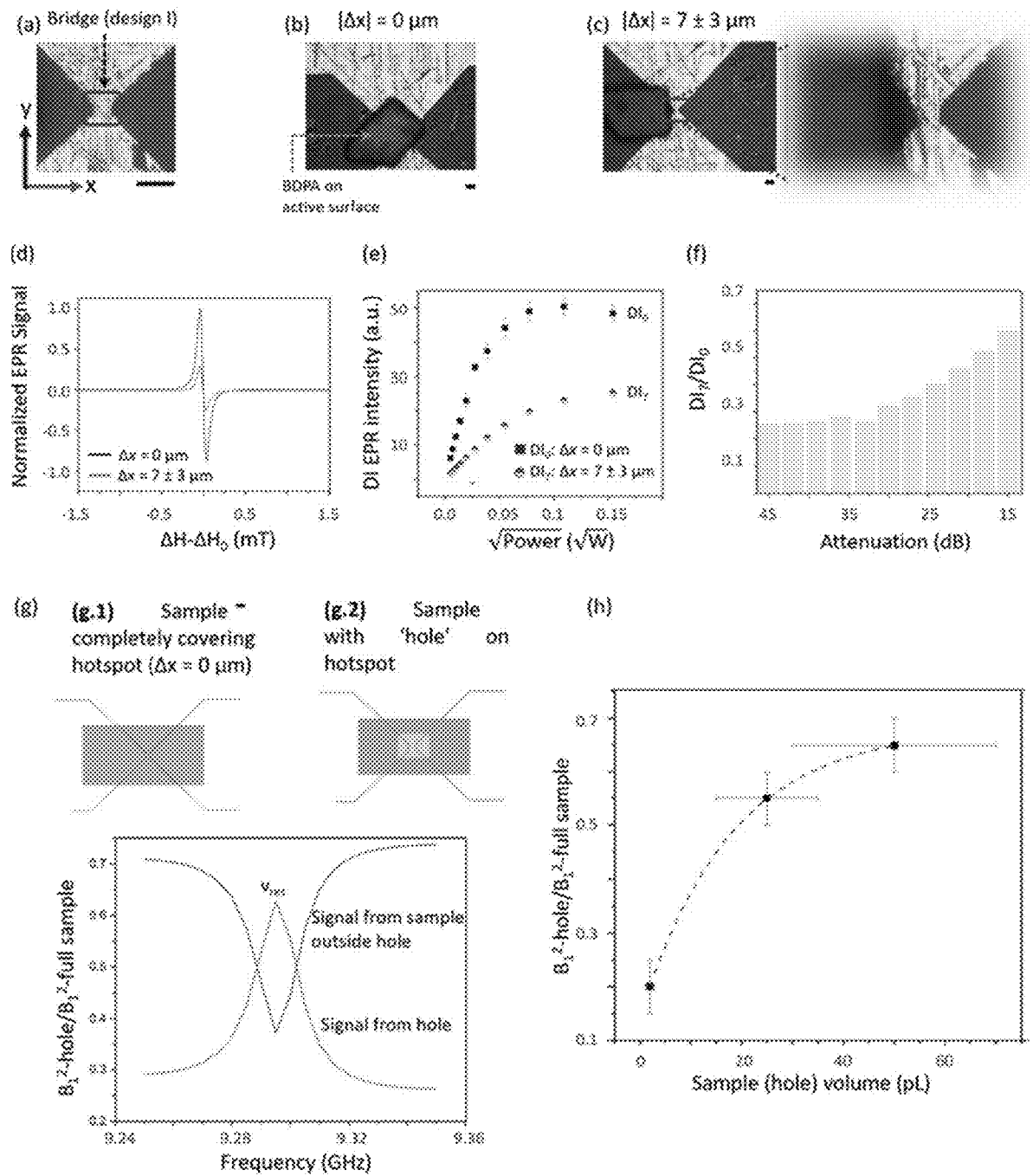
FIG. 8 shows a magnetic field region for 10 GHz planar inverse anapole microresonator. (a) Optical micrograph of a 10 GHz planar inverse anapole microresonator with the magnetic field region based on Design I (b), (c): Optical micrographs of a α,γ-Bisdiphenleine-β-phenylallyl (BDPA)-benzene crystal (approximately 50 µm×90 µm×15 µm) placed over the active surface (b), and 7 µm±3 µm away from the active surface (c). Scale bars in a-c & g represent 10 µm and the width of the central bridge is 5 µm. (d): Comparison of EPR spectra obtained from (b) and (c) at approximately 20 µW applied microwave power, and normalized to the maximum signal intensity obtained from (b); (e) Comparison of microwave power saturation curves i.e. plots of double-integrated (DI) signal intensity vs. square root of microwave power in positions (b) and (c). The maximum microwave power output of the EPR bridge is 158 mW. The error bars represent a single standard deviation in double-integrated area, due to random noise of the EPR spectrum. (f) Ratio of double-integrated signal intensities in positions (b) and (c) as a function of attenuation. (g) Simulation of loss of signal in sample excluding the active volume (hole) of (60×60×15) µm³, when compared to volume including active volume. (h) Normalized volume-integrals of $B_{1\perp}^2$ as a function of selected sample volume. As the sample radiates outwards from the central bridge, its weighted contribution to the signal decreases.

The patterned gold film converges on the small central bridge of Design I, with an area of approximately $(5\times5)\ \mu m^2$. FIGS. 7c-7e show plots of the simulated $B_{1\perp}^2$ and $B_{1\parallel}^2$ in the x, y and z directions, respectively, normalized to the highest value of $B_{1\perp}^2$. The dotted lines in the insets are the cut lines along which $B_{1\perp}^2$ and $B_{1\parallel}^2$ are plotted. They were chosen to cut through the region of strongest $B_1$ in the plane of the resonator. These distributions indicate that approximately 80% of $B_{1\perp}^2$ is localized within a volume of $(15\ \mu m\times20\ \mu m\times5\ \mu m)$ around the central bridge—i.e. approximately 1500 $\mu m^3$ or 1.5 pL. The dimension in the z direction is halved because only the volume above the resonator surface is available for sample placement. The tangential component of $B_1^2$ i.e. $B_{1\parallel}^2$ is also plotted in FIGS. 7c-7e and comprises less than 5% of the total $B_{1\perp}^2$. Table 2 shows the calculated mode volumes for the 2 different bridge designs at two different frequencies. In FIG. 8, we show that mode volumes are not an accurate representation of the volume responsible for most of the signal in an open resonant structure such as a microstrip resonator. The calculated mode volumes are much higher than the estimated active volume, and we show in FIG. 8 that most of the signal does indeed originate from a much smaller active volume at the center of the microresonator.

TABLE 2

|  | Design I, 10 GHz | | Design II, 10 GHz | Design I, 35 GHz | Design II, 35 GHz |
| --- | --- | --- | --- | --- | --- |
| $\nu_{res}$ | 9.3 to 9.8 | GHz | 9.3 to 9.8 GHz | 34.7 to 35 GHz | 34.7 to 35 GHz |
| Q (simulation) | 220 ± 20 | | 200 ± 20 | 580 ± 30 | 760 ± 50 |
| Q (experiment) | 250 ± 50 | | — | — | 250 ± 50 |
| Conversion efficiency (simulation) | 3 ± 0.4 | mT/√W | 9 ± 1 mT/√W | 11 ± 2 mT/√W | 3 ± 0.3 mT/√W |
| Conversion efficiency (experiment) | 3 ± 0.3 | mT/√W | — | — | 6 ± 1 mT/√W |
| $P_{1/2}$ (experiment) | 0.025 ± 0.05 | mW | — | — | Lower than lowest available power |
| Mode volume (simulation)* | 30 | nL | 3 nL | 400 pL | 4 nL |

In Table 2, mode volume was calculated based on the filling factor of a small volume in the magnetic field region of the microresonator by the following formula.

$$\text{Mode volume} = \text{Small volume} * \frac{\int_{resonator} B_{1\perp}^2 dV}{\int_{small\ volume} B_{1\perp}^2 dV}$$

The estimated active volume and trends in simulations of field distributions were verified by simulating and observing the loss in signal when a sample is moved away from the magnetic field region (FIG. 8). A single crystal of the α,γ-bisdiphenylene-β-phenylallyl (BDPA)-benzene complex was placed on the $B_1$ hotspot and then moved away by a small increment along the x-axis. The crystal had a volume of about 70 pL and covered an area much larger than the active area of the resonator. FIG. 8a shows the magnetic field region of the microresonator surface with no sample on it. FIGS. 8b and 8c show the sample at two different positions separated in x by 7 μm±3 μm. The BDPA-benzene crystal was chosen because it has a strong and narrow signal that is easy to quantify. Based on the large extent of the BDPA microcrystal compared to the size of the magnetic field region, the reduction in signal intensity going from 3b to 3c is attributed solely to the change in amount of sample occupying the resonator active volume. In 3b, the entire active volume is occupied by the BDPA-benzene crystal. Moving the crystal 7 μm±3 μm away from the magnetic field region causes the signal intensity to decrease by 75%, as seen from the continuous wave (CW) EPR spectra in FIG. 8d. Because they and z dimensions are also much larger than the simulated dimensions of the active volume, this reduction in signal intensity can be used to directly estimate the active range along the x-axis. Assuming an equal range on both sides of the active surface, the active range along the x-axis is estimated to be 20 μm, which is comparable to the active range indicated by FIG. 7c. FIG. 8e shows the power-saturation curves with the BDPA in positions 3b and 3c. FIG. 8f shows that the ratio of double-integrated signals from 3b and 3c reaches a constant value upon saturation. These results suggest that even if a large sample is placed on the hotspot, most of the signal originates from a small volume around the central bridge. To estimate the volume responsible for a majority of the signal from a large sample, we used finite element simulations to obtain the integral of $B_1^2$ over a large sample, and over smaller sub-volumes at the center of the sample. The field inhomogeneity in planar microresonators makes it difficult to estimate the active volume of the resonator. For example, FIG. 8h shows that a volume of approximately 2 pL around the central bridge shown in 3a accounts for 20% of the total integrated $B_{1\perp}^2$ over a large sample. A volume of approximately 25 pL accounts for 55% of the integrated $B_{1\perp}^2$ whereas a volume of approximately 50 pL accounts for 65% of the total integrated $B_{1\perp}^2$ over a large sample. This weighted distribution of $B_{1\perp}^2$ is graphically represented in FIG. 8g. The mode volumes calculated in Table 2 are much higher than the active volume of approximately 50 pL to 100 pL estimated from FIG. 8g. This discrepancy can be explained by considering the high $B_1$ inhomogeneity and diffuse nature of $B_1$ distribution on the resonator surface.

Figure 9:
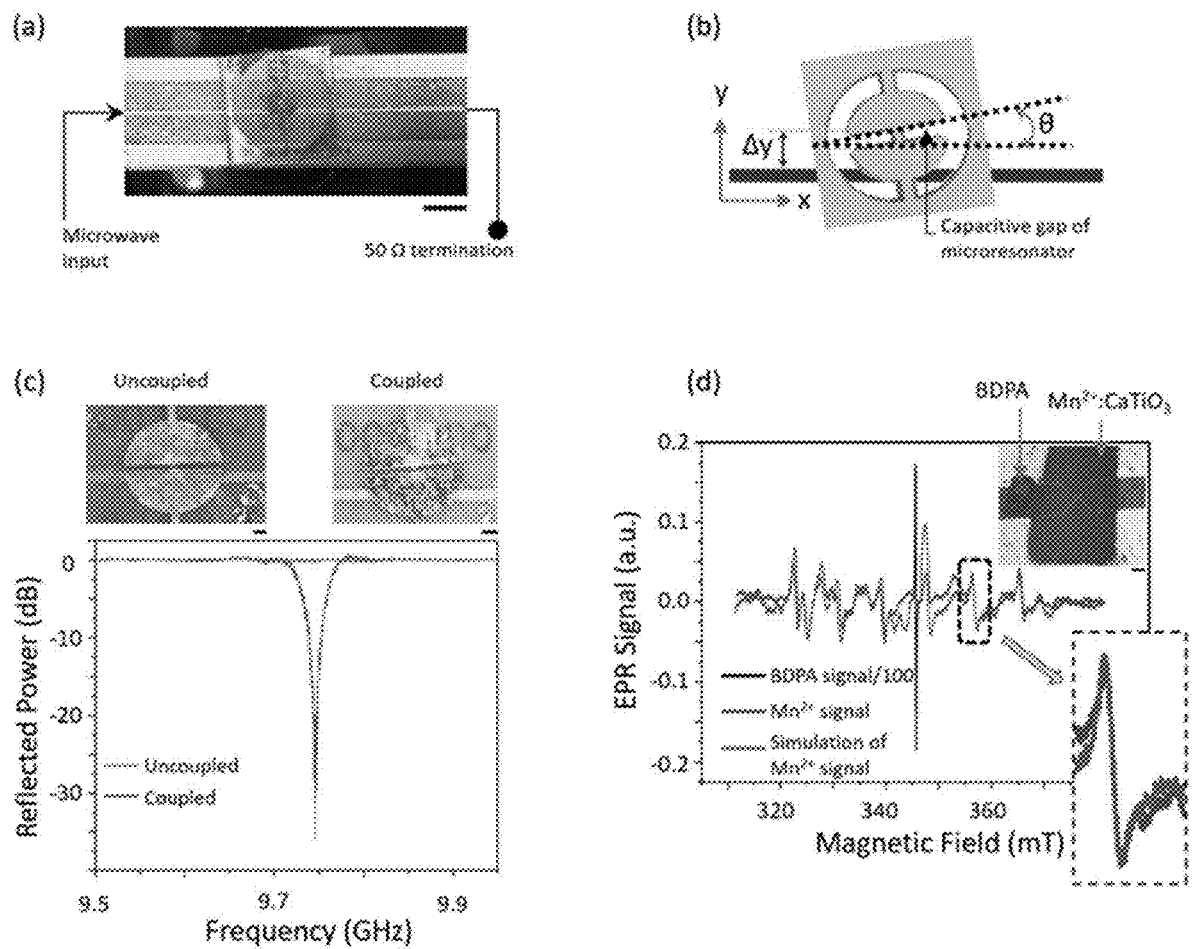
FIG. 9 shows microwave coupling between inverse anapolic pattern and the microwave conductor of the microstrip in the planar inverse anapole microresonator. (a) 10 GHz planar inverse anapole microresonator that replaces the resonator in an EPR spectrometer. Scale bar=5 mm. (b) Representation of the planar inverse anapole microresonator, showing the position parameters that can be used to control microwave coupling. The double-headed arrow indicates the y-offset of the resonator center from the central conductor of the microstrip. (c) Photographs show the microresonator position in the uncoupled and critically coupled states (dashed blue lines are visual aids to demarcate the tops of the microstrip and capacitive gap of the microresonator). Both scale bars represent 0.5 mm. The plots are shown for reflected microwave power vs. frequency for the uncoupled state and critically coupled states after background subtraction. (d) Simulated and experimental continuous wave (CW) EPR spectra of 0.05 mole % $Mn^{2+}$-doped $CaTiO_3$. The sharp line at the center is the signal from the BDPA microcrystal used for modulation coil calibration. The BDPA signal has been adjusted to make it visually comparable to the $Mn^{2+}$ signal. The experimental spectrum was obtained using the coupled planar inverse anapole microresonator from (c). The inset optical micrograph shows the single microparticle placed over the microresonator. The dashed lines show edges of the microresonator below the sample. The signal-to-noise ratio (SNR) of the component in the dashed box was used for sensitivity calculations.
Figure 10:
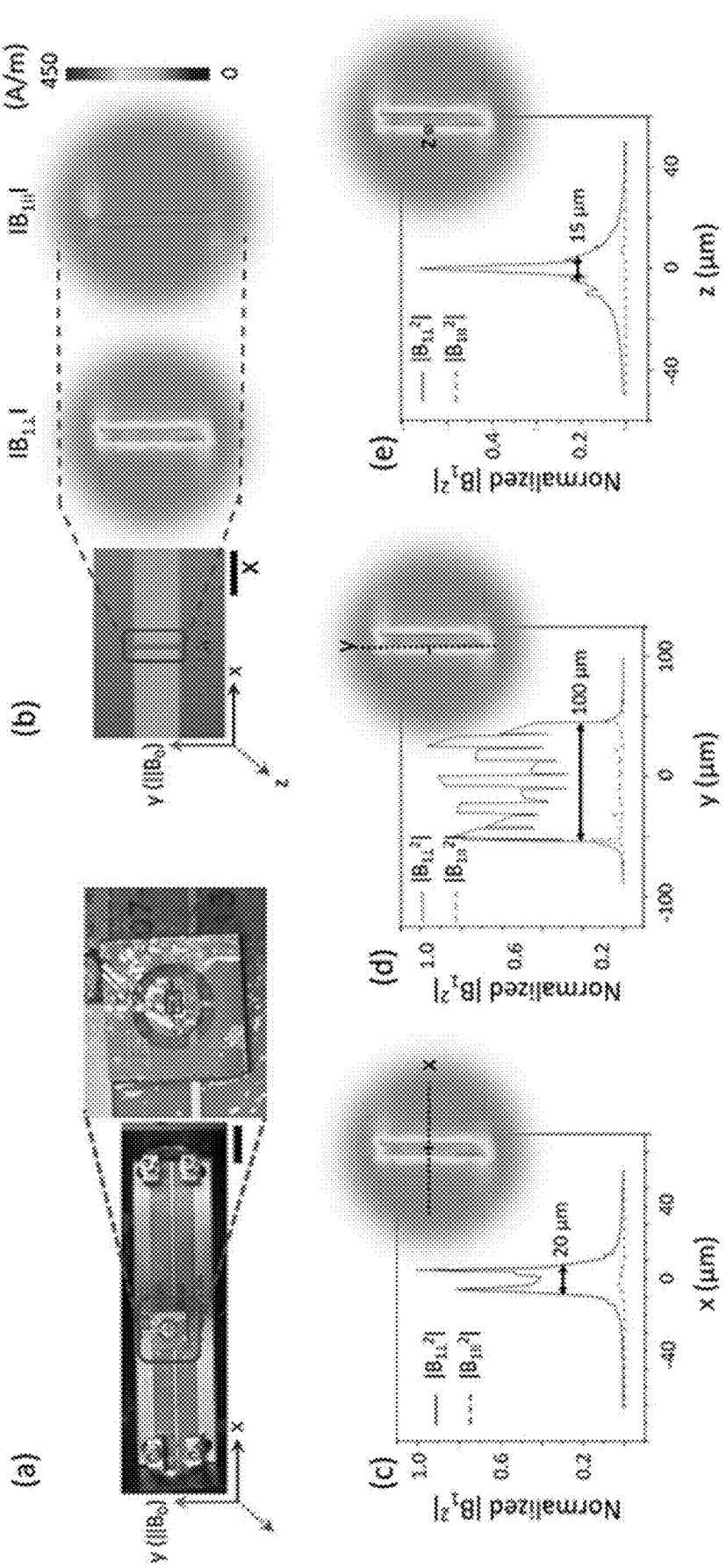
FIG. 10 shows a 35 GHz planar inverse anapole microresonator and simulation of active volume of the magnetic field region. (a) planar inverse anapole microresonator operating at 35 GHz. The zoomed-in region on the right shows the microresonator chip (the outline encloses the magnetic field region). (b) Optical micrograph of the magnetic field region. The right panel shows the simulated distributions of the absolute values of perpendicular and tangential components of $B_1$ in the x-y plane, showing the central $B_1$ 'hotspot' in a small volume around the central bridge (c, d, e). Normalized absolute values of $B_{1\perp}^2$ and $B_{1\parallel}^2$ along the x, y, and z co-ordinates. An input voltage of 1 V and impedance of 50Ω i.e. an input power of 20 mW was set in the finite element simulations.
Figure 18:
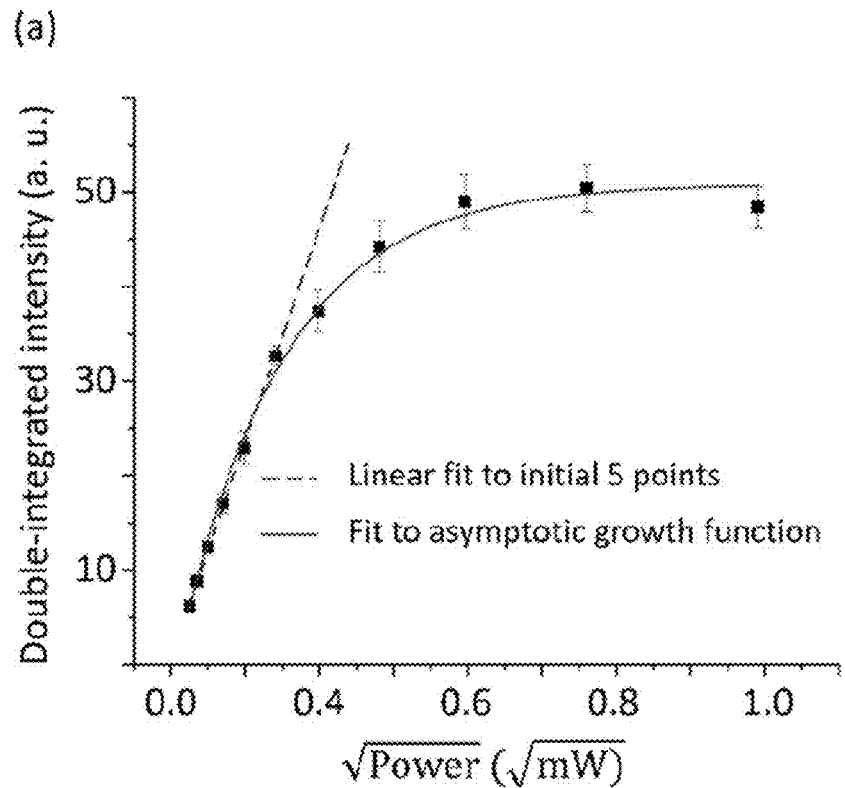
FIG. 18 shows (a) fits of the power saturation curve of BDPA on 10 GHz planar inverse anapole microresonator to linear and asymptotic growth functions. The power at which the curve deviates from the linearity is taken as the saturation power. (b) Fit of peak-to-peak amplitude 'A' vs. power 'P' to the following eqn.: $A=IP_{1/2}[1+(2^{1/\epsilon}-1)P/P_{1/2}]^{-\epsilon}$. The fit yielded $\epsilon=0.5\pm0.1$, indicating highly inhomogeneous saturation.
Figure 18:
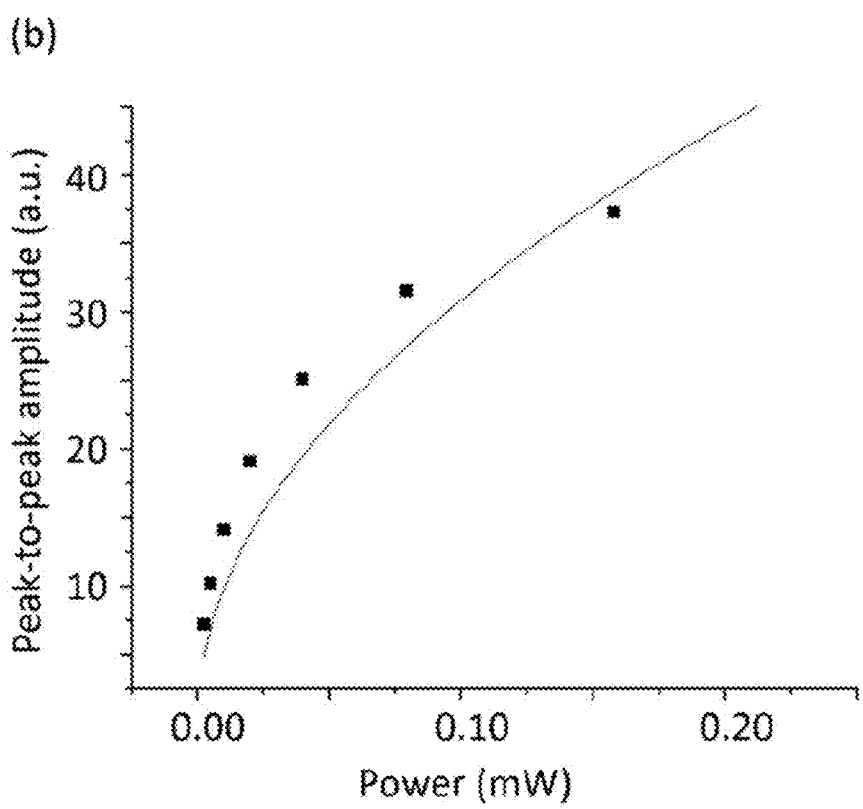

FIG. 8f shows the power saturation curves of the BDPA-benzene single crystal placed at positions 3b and 3c. The error bars represent a single standard deviation in double-integrated area, due to random noise of the EPR spectrum. Crystalline BDPA saturates at a $B_1$ value of 0.03 mT (assuming a conversion factor of approximately 0.1 mT/$\sqrt{W}$ for a rectangular cavity with a Q-factor of approximately 3000). The power saturation curves were fit to an asymptotic growth function and the saturation power was defined as that at which the saturation curve deviates from linearity (see FIG. 18(a)). By this analysis, the power-to-field conversion efficiency for the microresonator-microstrip device (FIG. 9) used in FIGS. 7 and 8 was found to be (3±0.5) mT/$\sqrt{W}$. The error represents a single standard deviation due to uncertainty in the power corresponding to saturation. The simulated value of the conversion efficiency based on the highest value of $B_{1\perp}$ in the model is (3±0.4) mT/$\sqrt{W}$ (see Table 2). These values appear to be low for the active volume in consideration and are comparable at 10 GHz and 35 GHz. The apparently low conversion efficiency is calculated based on the nominal output power of the bridge. In reality, only a small fraction of this power is ultimately coupled into the microresonator. Secondly, while the active volume is about 1 pL to 10 pL, it is much smaller than the outer dimensions of the resonator. Thus, a decrease in overall size of the resonator is not expected to have a significant effect on the filling factor or conversion efficiency. While there appears to be a reasonable correspondence between the experimental and simulated conversion efficiencies, there are many parameters that affect the coupling between the microresonator and microstrip and hence can be used to tune the conversion efficiency.

This conversion efficiency does not account for the $B_{1\perp}$-inhomogeneity in the magnetic field region, which can be disadvantageous for pulse measurements. An estimate of the $B_1$ homogeneity can be obtained from the power saturation curve. This analysis of the power saturation data in FIG. 8 resulted in a value of ε=0.5±0.1, indicating highly inhomogeneous saturation. The fit is presented in FIG. 18(b).

Figure 19:
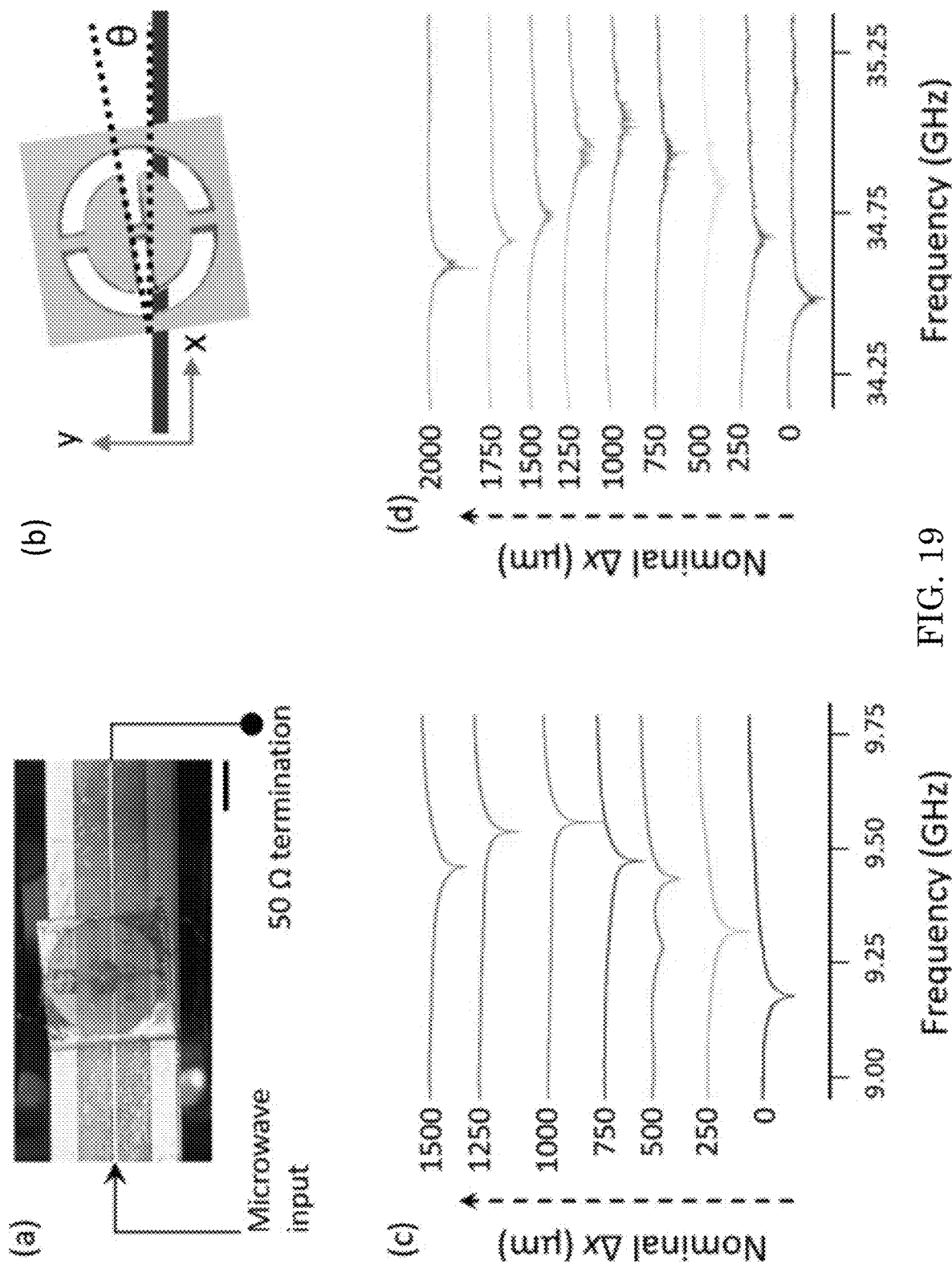
FIG. 19 shows (a) a plan view of a coupled microresonator-microstrip in a planar inverse anapole microresonator. (b) A plan view of the planar inverse anapole microresonator showing the parameters x, y, and θ, which affect resonant frequency and coupling. (c) Dependence of resonant frequency of the 9.75 GHz planar inverse anapole microresonator on the x-position of the microresonator relative to the microstrip. (d) Dependence of resonant frequency of the 35 GHz planar inverse anapole microresonator on the x-position of the microresonator on the microstrip.
Figure 20:
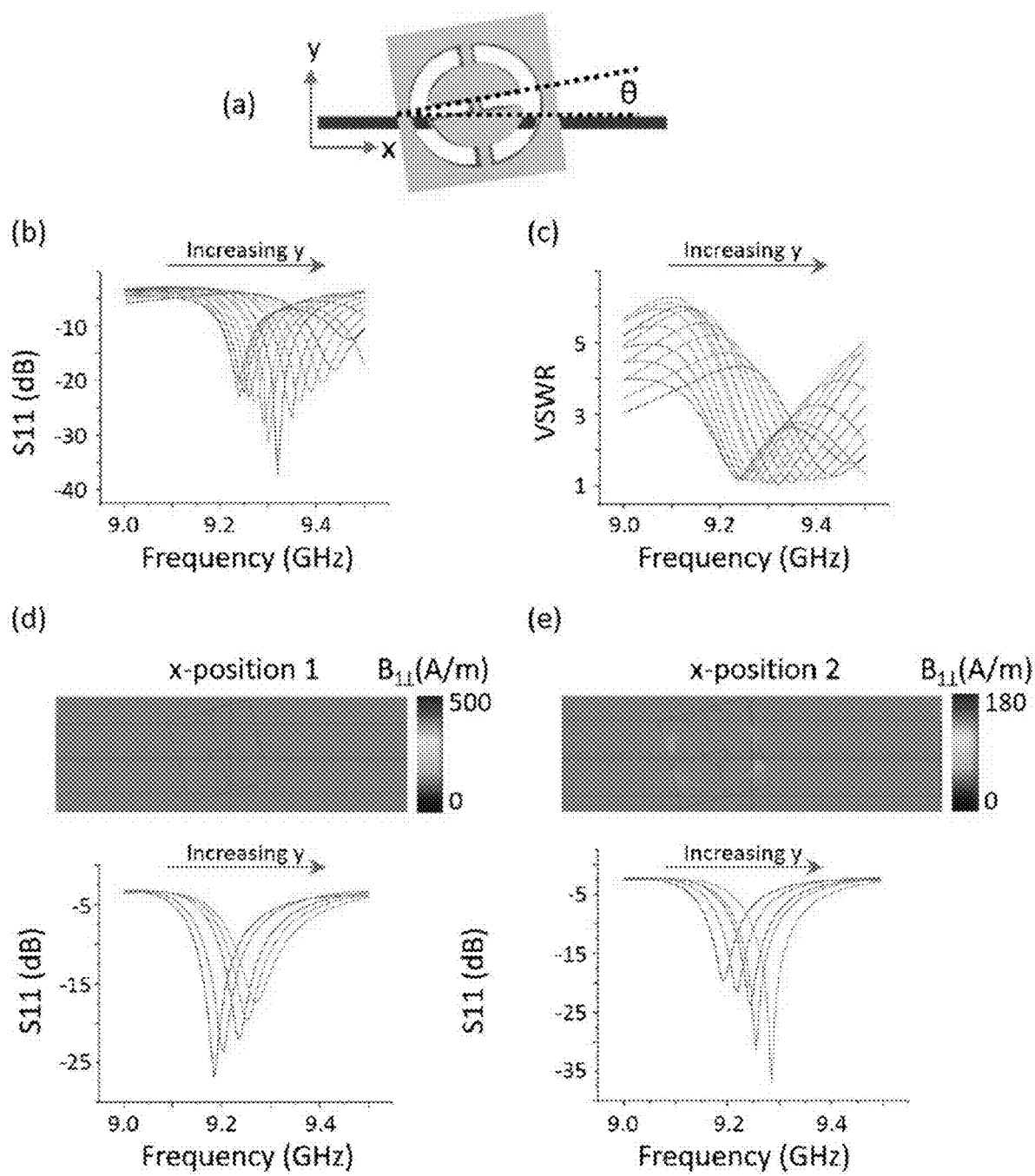
FIG. 20 shows (a) a plan view of the planar inverse anapole microresonator showing the parameters x, y, and θ, which affect resonant frequency and coupling. (b) Simulation of shift in resonant frequency upon changing y-position at constant x-position and θ, evident from the change in S11 profiles. (c) Changes in voltage standing wave ratio corresponding to the scans in (b). (d) and (e) Comparison of coupling at incremental positions, when x is changed by approximately 4 mm from (d) to (e). These data show that they-position has a dominant effect in determining resonant frequency and coupling. However, when x is changed, the y-position of critical coupling also changes, which in turn shifts the resonant frequency of the device at critical coupling. The field distributions in (d) and (e) show that the conversion efficiency is also dependent on they-position at which critical coupling occurs.
Figure 21:
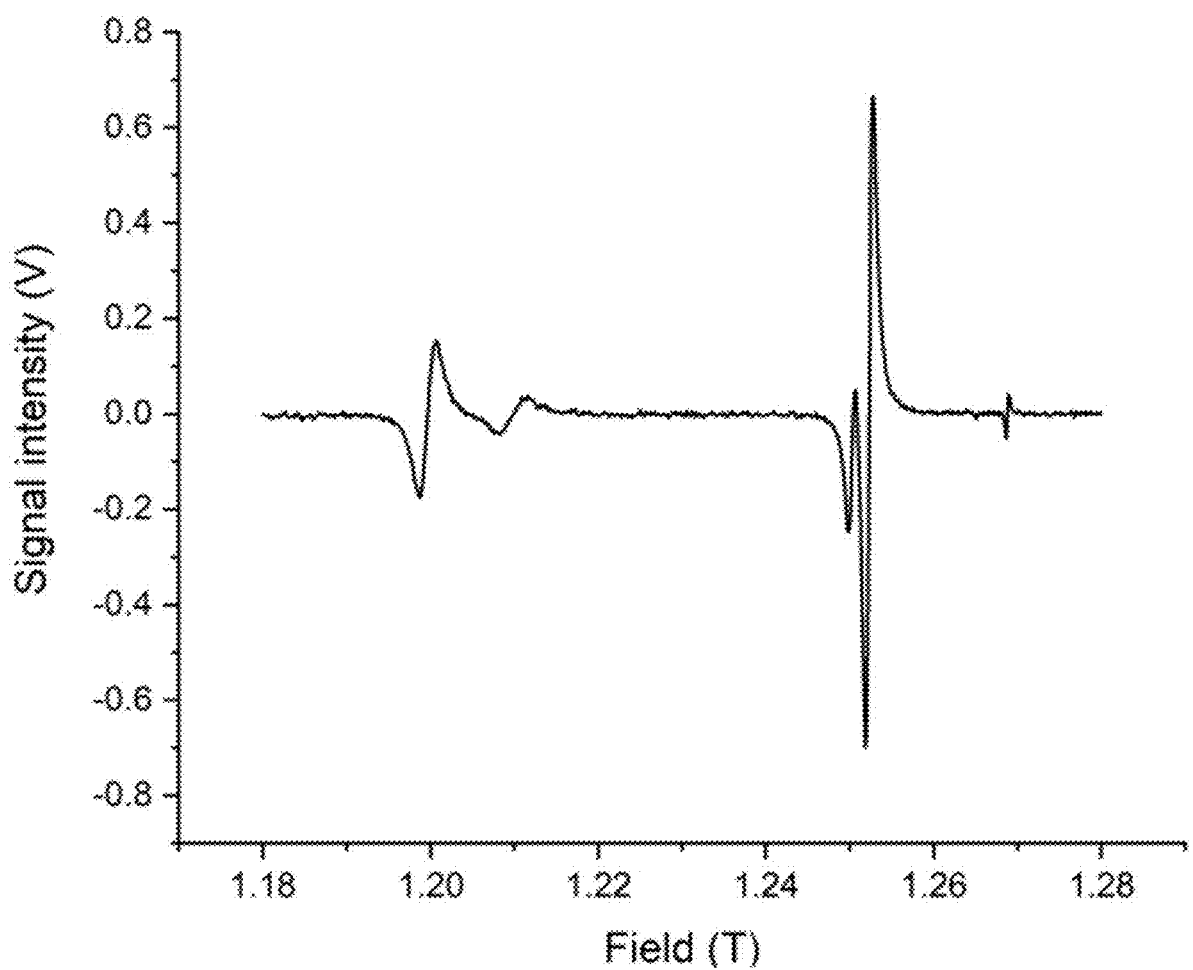
FIG. 21 shows the CW EPR spectrum of 0.01 mole % $Fe^{3+}:SrTiO_3$, obtained from a planar inverse anapole microresonator operating at 35 GHz.

With regard to coupling and tuning, an advantage of the planar inverse anapole resonator is that its overall large size allows easy coupling to an external microwave feedline. FIG. 9a shows a microresonator-microstrip device operating at 9.75 GHz. The microresonator is adhered to a microstrip using a small amount of silicone grease. The position of the microresonator relative to the central conductor of the microstrip is defined in terms of three parameters: x (distance along the central conductor of the microstrip), y (vertical offset from the central conductor), and θ (angle between the central conductor and capacitive gaps of the microresonator). The parameters y and θ can be used to control the coupling between the microstrip and the microresonator (FIG. 9b). The photographs in FIG. 5c show the relative positions of the microresonator with respect to the microstrip in the critically coupled and uncoupled states. Also shown are the experimental plots of the reflection coefficient (S11) versus frequency in the critically coupled and uncoupled states, showing a resonance frequency of 9.75 GHz for the critically coupled device. The linewidth at 3 dB below the baseline is typically used as an estimate of the Q-factor. Therefore, it is important to establish the baseline by comparing S11 profiles of the coupled and uncoupled devices. Using these data, the experimental Q-factor is estimated to be 250±50 at room temperature. The error is a single standard deviation due to variability in coupling of the microresonator and microstrip. Since we have used low-loss dielectric substrates, we attribute this improvement in Q-factor at room temperature to the diminished radiation losses provided by the inverse anapole mode. This improvement is obtained while confining $B_1$ to a volume about 1 pL. Q-factors in the range of $10^4$ to $10^5$ can be obtained for arrays of coupled resonators in the metamaterial. However, the planar inverse anapole microresonator is a unit of the metamaterial array and therefore intrinsically has a lower Q-factor compared to an array. Secondly, the thin metal layer deposited on a dielectric substrate results in additional losses. These factors combine to yield Q-factors that are much smaller than observed by some others. We observed that the resonant frequency of the microresonator-microstrip device can be varied simply by changing the position of the microresonator on the microstrip (FIG. 19). This method provides a tunability of approximately 500 MHz at both 10 GHz and 35 GHz. FIGS. 19 and 20 of Supporting Information provide a detailed phenomenological description of the dependence of device frequency and coupling on x, y, and θ.

Testing microresonator sensitivity at room temperature. We tested the sensitivity of the planar inverse anapole microresonator by obtaining EPR spectra of a dilute (0.05 mole %) $Mn^{2+}$-doped sample of $CaTiO_3$ (inset of FIG. 9d), using the critically coupled device with a resonance frequency of 9.75 GHz. A crystal of BDPA was used to calibrate modulation coil settings. Currently, single-crystal data for dilute perovskite oxide single crystals are difficult to obtain because 1) availability of doped single crystals is limited, 2) there is a high amount of expertise required to grow single crystal perovskites, 3) high-quality single crystals grown from conventional melt processes exhibit defect in homogeneities, and 4) non-conventional growth techniques result in crystallite volumes that are typically smaller than 1 pL and often closer to 1 fL. Therefore, in conventional EPR spectrometers, novel perovskite chemistries can be measured in their polycrystalline form, usually as compressed pellets consisting of thousands of microparticles, with a total volume of several microliters. To test the sensitivity of the microresonator, we picked out a microparticle with a total volume of approximately 5 nL (FIG. 5d). The finite element simulations detailed in FIG. 8 suggest that only (50±20) pL of this large volume is probed by the microresonator. We use this simulated active volume to estimate the sensitivity, although further corroboration is required using a smaller crystal of volume <100 pL. To estimate the sensitivity, we chose the signal enclosed in the dashed outline in FIG. 9d because it is clearly identifiable, and its linewidth and peak-to-peak signal intensity can be determined with reasonable certainty. The data shown in FIG. 9d were obtained with a microwave power output of 158 mW from the 10 GHz EPR spectrometer system. As noted in the discussion of conversion efficiency above, the actual power incident on the microresonator is a small fraction of the nominal input power from an EPR spectrometer microwave source. The total spin density for this sample is approximately $9 \times 10^{18}$/mL. Therefore, the total number of $Mn^{2+}$ spins in the active volume of (50±20) pL is approximately $5 \times 10^{11}$. The number of spins contributing to the chosen line was calculated from the ratio of its double-integrated intensity to the double-integrated intensity of the complete spectrum, excluding the BDPA signal. This ratio was found to be (10±2)%, leading to a spin count of $5 \times 10^{10}$ for the chosen line. The error is a single standard deviation due to uncertainty in observed linewidth. In previous reports, the sensitivity is normalized per unit signal-to-noise ratio (SNR), linewidth and square root of the detection bandwidth. In the present case, these numbers are 25, 0.8 mT, and 0.7 $\sqrt{Hz}$, respectively. Using these values and the previous sensitivity calculation approach, our demonstrated lower limit of detection is:

$$\frac{5*10^{10}}{25*0.8*0.7} = (3\pm1)*10^9/mT\sqrt{Hz}.$$

If the sensitivity is calculated based on another method, the total linewidth for the spectrum would be approximately 40 mT. Therefore, the higher limit of calculated sensitivity, given by the number of spins in the active volume ($1 \times 10^{10}$), normalized to the linewidth (40 mT), bandwidth (0.7 $\sqrt{Hz}$), and SNR (25), is:

$$\frac{5*10^{11}}{25*40*0.7} = (7\pm2)*10^8/mT\sqrt{Hz}$$

The data were obtained by integrating our devices into standard operational EPR spectrometers. We anticipate that further refinements in the detection circuitry will allow us to increase the power incident on the microresonator and will result in further improvements in volume-sensitivity.

The experimental EPR spectrum was validated by simulations using isotropic Landé g-factor=2.001, isotropic hyperfine splitting parameter A=239.3 MHz, linewidth=0.5 mT, zero field splitting parameters D=434 MHz and E=−41 MHz. Random noise to produce a SNR of 25 was added to the simulated spectrum, to match the SNR measured from experiment.

Scalability to higher frequencies. We report the first CW EPR spectra acquired from pL active volumes at 35 GHz. FIG. 10a shows a microresonator-microstrip device operating at 35 GHz. FIG. 10b shows an optical micrograph of the magnetic field region (outlined in red in FIG. 10a) based on Design II. The area of the active surface is ≈1000 $\mu m^2$. FIGS. 10c, 10d, and 10e show the distribution of $B_{1\perp}$ along the x, y, and z directions, respectively.

Figure 11:
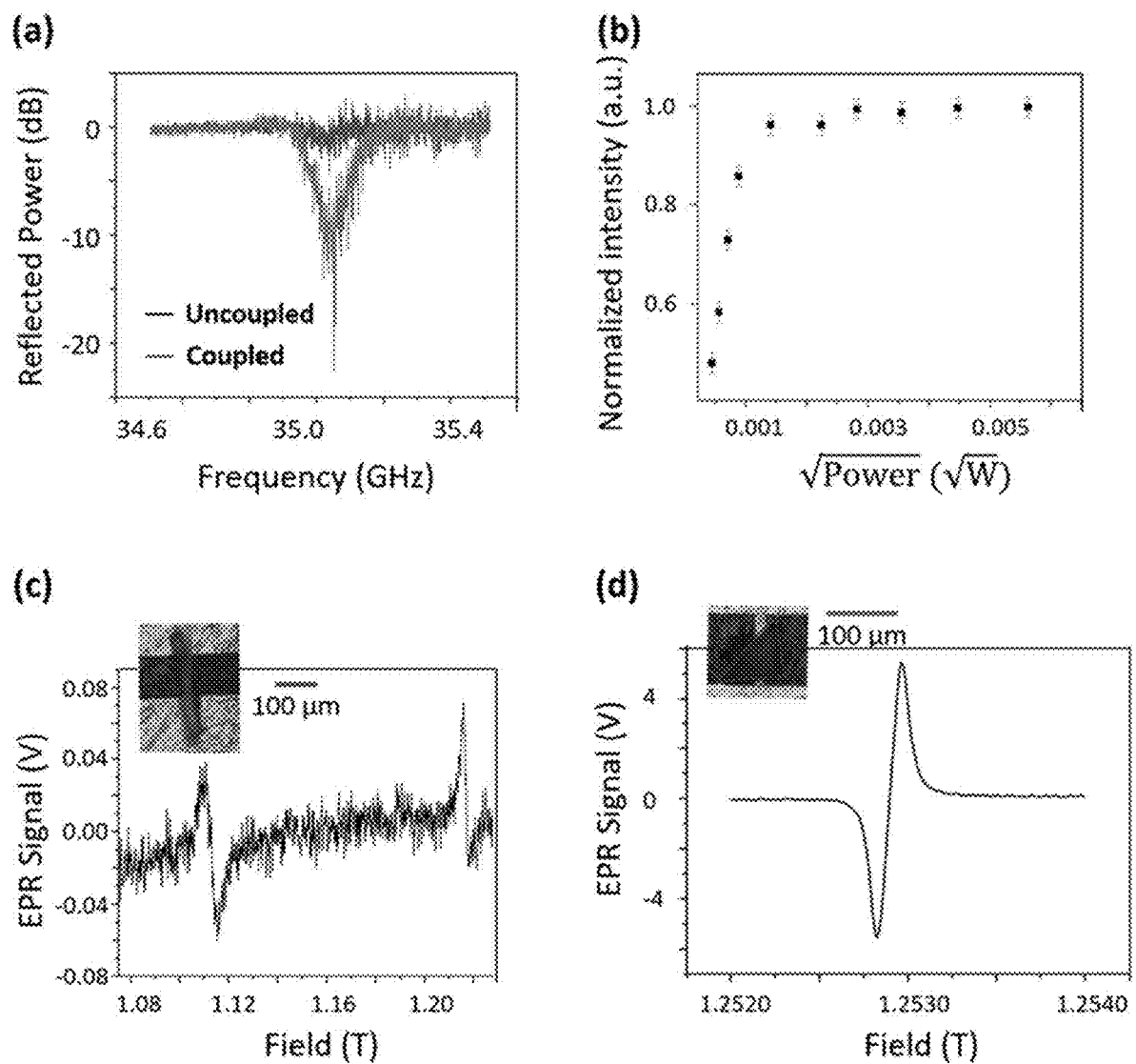
FIG. 11 shows performance of the 35 GHz planar inverse anapole microresonator. Characteristics of planar inverse anapole microresonator operating at 35 GHz. (a) Frequency profiles of reflection coefficient in the uncoupled and critically coupled states. (b) Power saturation curve for a BDPA-benzene single crystal. The error bars represent systematic uncertainty of a single standard deviation in double-integrated area due to splitting of the EPR signal detected in the I/Q channels. (c) CW EPR spectrum of a microcrystal of $CuCl_2.2H_2O$. (d) CW EPR spectrum of a microcrystal of BDPA-benzene complex.

As is the case at 10 GHz, the coupling of the 35 GHz microresonators is controlled via the y-position and orientation θ of the microresonator relative to the central conductor of the microstrip. The frequency profiles of reflection coefficient in the coupled and uncoupled states are shown in FIG. 11a. The Q-factor of this microresonator-microstrip device is 250±50. The error is a single standard deviation due to variability in coupling between the microresonator and microstrip. The power-to-field conversion ratio, determined from the power saturation curve for the BDPA-benzene complex, is (7±1) mT/$\sqrt{W}$ (FIG. 11b). The error is a single standard deviation due to uncertainty in measurement of the power at which the EPR signal saturates. The maximum power output of the 35 GHz EPR spectrometer in CW mode is 200 mW.

FIGS. 11c and 11d show CW EPR spectra obtained from microcrystals of $CuCl_2.2H_2O$ and crystalline BDPA-benzene complex, respectively. The signal intensity for $CuCl_2.2H_2O$ is limited by our maximum modulation amplitude of 0.1 mT (limited by spectrometer settings in the present case), compared to the linewidth of 5.5 mT. For $CuCl_2.2H_2O$, the Landé g-factor, $[g_a\ g_b\ g_c]$=[2.187 2.037 2.252]. We surmise that the two observed signals at 11.1 T and 12.1 T are caused by crystal twinning. We have also obtained CW EPR spectra for a dilute (0.01 mole %) doped single-crystal of $Fe^{3+}:SrTiO_3$.

The CW EPR spectra was obtained from picoliter volumes at 35 GHz with improved coupling provided by better Q-factors and shows scalability of the planar inverse anapole design to higher frequencies, which has previously been a significant obstacle in application of conventional microresonators to higher-frequency EPR experiments.

The planar inverse anapole microresonator has a toroidal metamaterial unit to improve the Q-factors of EPR microresonators by an order of magnitude while confining the microwave magnetic field to pL volumes. The improvement in Q-factors enables CW EPR experiments by integration of microresonator-microstrip devices into standard operation EPR spectrometers. Experimental demonstration of the active volume was provided using CW EPR spectra of a strongly paramagnetic sample. The CW EPR spectrum obtained for a microparticle of <0.05 mole % $Mn^{2+}:CaTiO_3$ yields a spin detection limit of $(7\pm2\times10^8)/mT\sqrt{Hz}$. $Mn^{2+}$-doped $CaTiO_3$ and $Fe^{3+}$-doped $SrTiO_3$ samples were used to show the applicability of this resonator to dilute doped samples of oxides, but the results apply equally to any other dilute microcrystal. We have shown that the planar inverse anapole microresonator can be incorporated into existing spectrometers for easy deployment. This resonator design can easily couple to a microwave feedline and is scalable to higher frequencies without sacrificing ease of implementation, overcoming these limitations of previous microresonator designs. Easily applicable microresonator designs are necessary for routine studies of nanomaterials, for example, perovskite microcrystals and thin films, and biomacromolecular single crystals such as microcrystals of metalloenzymes. Owing to their ease of coupling with a microwave feedline and high power-to-field conversion efficiencies, these devices can be applied in EPR imaging modalities.

Finite element simulations were conducted, and the planar inverse anapole microresonator was modeled as a perfectly conducting plane on a dielectric slab. The model included the microstrip and the microresonator. The microstrip included a dielectric with a ground plane on one face and a central conducting strip on the other face. The microresonator was modeled with the dielectric substrate directly in contact with the central conductor of the microstrip, and the metallic face pointing upward so that the metal film is separated from the central conductor of the microstrip by the dielectric of the microresonator. The dielectric constant of the microresonator substrate was set to 22 and that of the microstrip substrate was set to 3.55. A schematic of the complete model is provided in FIG. 15 while FIG. 16 shows the dimensions of features of the metallized layer.

The planar inverse anapole microresonators were fabricated on either lanthanum aluminate (LAO) or lanthanum aluminate-strontium aluminum titanate (LSAT) substrates with a thickness of 500 μm and dielectric constants of ranging from 22 to 25. The substrates were first cleaned in piranha solution and then spin-coated with photoresist (LOR 10 pre-baked at 175° C. followed by SPR 220 pre-baked at 115° C.). The resonator layout was patterned into the photoresist using a UV laser (375 nm at 300 mJ/cm$^2$). The resist was developed using MIF300. The surface of the coated dielectric was then cleaned by reactive ion etching with oxygen plasma. Next, a 30 nm thick film of Ti followed by a 500 nm thick film of gold were deposited over the patterned photoresist using e-beam evaporation. Excess gold was removed by manual liftoff (soaked in Remover 1165 overnight). Finally, a 50 nm layer of silicon nitride was deposited using plasma-enhanced chemical vapor deposition, to protect the gold from abrasion.

The planar inverse anapole microresonators were coupled to a RO4003 microstrip feedline. The anapolic substrate was adhered to the microstrip using a small amount of silicone grease and was critically coupled to the microstrip by adjusting its position relative to the central conductor of the microstrip. The microstrip was terminated with a 50Ω load. Coupling was monitored using a vector network analyzer (VNA). Internal reflections from the coaxial cable were calibrated out by 1-port short-open-load (SOL) calibration.

For EPR spectroscopy, the critically coupled planar inverse anapole microresonator was affixed in a holder made of acrylonitrile butadiene styrene (ABS). To provide modulation of the static magnetic field, commercial air-core inductor coils were mounted on this holder and connected to the modulation amplifier in either the 10 GHz spectrometer or 35 GHz spectrometer. The microstrip was connected to the spectrometer bridge in each instrument using a coaxial cable. The microresonator-microstrip device was mounted on the ABS holder and placed in between the magnet poles of the spectrometer on an ABS post (FIG. 23 of the Supporting Information). In the EPR spectrometer operating at 10 GHz, the reference arm was kept on and the microwave frequency was locked at a value (around the dip observed on the VNA) that yielded an absorption lineshape. An automated procedure was run to match the response of the external modulation coils to the modulation amplitude settings in the EPR spectrometer. Here the bandwidth of detection for CW spectra was defined as (0.5*conversion time). The 35 GHz spectrometer operates without a reference arm. The resonant frequency of the 35 GHz microresonator-microstrip device was first identified on the VNA and then confirmed in the spectrometer. In the 35 GHz system, we were able to apply a maximum modulation amplitude of only ≈0.1 mT due to internal settings. The modulation amplitude was determined from the linewidth of the EPR absorption line of a BDPA-benzene crystal. Here the bandwidth was defined as $1/2\pi\tau$, where $\tau$ is the time constant.

Regarding sensitivity analysis, sensitivity of an EPR resonator can be quantified in terms of the signal-to-noise ratio (SNR). Here, the noise is the thermal noise of all the circuit elements including the microresonator and the detector. The signal is the voltage induced in the resonator loop by the processing magnetization of the sample placed in the magnetic field region of the resonator as in the following equation that shows that the SNR and sensitivity of a resonator is directly proportional to resonator filling factor (η) and quality factor (Q-factor). The CW EPR signal intensity, in terms of voltage ($V_S$), is given by the following formula.

$$V_S = \chi'' \eta Q_L \sqrt{P_A Z_0}$$

wherein η is the resonator filling factor; QL is the loaded quality factor of the resonator; PA is the microwave power, in W, incident on the microresonator (i.e., the microwave power at the end of the microwave transmission line); and Z0 is the characteristic impedance of the microwave transmission line (in Ω). $\chi''$ is the dimensionless imaginary component of the effective RF susceptibility.

The filling factor η is given by the equation:

$$\eta = \frac{\int_{sample} B_1^2 dV}{\int_{resonator} B_1^2 dV} = \frac{V_{sample} \langle B_1^2 \rangle_{sample}}{V_{res} \langle B_1^2 \rangle_{res}}$$

When $B_1$ is homogeneous over the resonator mode volume, the filling factor can be equated to the ratio of sample volume divided by the mode volume. This is indicated by the right side of the above equation. The above formula is applicable for resonators with homogeneous $B_1$ distributions, such as cavity resonators or dielectric ring resonators. In structures with large $B_1$-inhomogeneity, volumes with high $B_1$ can make a disproportionately large contribution to the EPR signal. In such cases, the $B_1$ concentration may be defined in terms of the mode volume, as shown in Table 2.

The quality-factor Q can be defined in terms of resonator bandwidth as provided in the following equation.

$$Q = \frac{v_{res}}{\Delta v}$$

wherein $v_{res}$ is the resonant frequency and $\Delta v$ is the resonator bandwidth at 3 dB below the baseline.

The quality-factor Q can be defined in terms of energy retention in the resonator by the following equation.

$$Q = \omega \frac{\text{average energy stored in resonator volume}}{\text{average power dissipated from resonator surfaces}}$$

The thermal noise in a detection setup with a characteristic impedance of 50Ω can be calculated by the following formula.

$$N = \sqrt{4 k_B T R \Delta f}$$

wherein $k_B$ is Boltzmann's constant; T is temperature; R is the resistance of the microresonator coil, and $\Delta f$ is the bandwidth of the detection electronics.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A planar inverse anapole microresonator comprising:
    an anapolic substrate;
    an anapolic conductor disposed on the anapolic substrate and comprising a first inverse anapolic pattern and a second inverse anapolic pattern arranged such that the second inverse anapolic pattern is disposed in a plane with the first inverse anapolic pattern and opposes the first inverse anapolic pattern;
    each inverse anapolic pattern comprising:
        a semi annular arm that terminates in a first arm tendril and a second arm tendril distal to the first arm tendril; and
        a medial arm extending from a concave portion of the semi annular arm and terminating at a medial tip distal to the concave portion of the semi annular arm so that the medial tip is separated from the first arm tendril and the second arm tendril and medially disposed between the first arm tendril and the second arm tendril, such that:
        the first arm tendril of the first inverse anapolic pattern opposes the first arm tendril of the second inverse anapolic pattern;
        the second arm tendril of the first inverse anapolic pattern opposes the second arm tendril of the second inverse anapolic pattern; and
        the medial tip of the first inverse anapolic pattern opposes the medial tip of the second inverse anapolic pattern,
    such that the medial tip of the first inverse anapolic pattern is separated from the medial tip of the second inverse anapolic pattern by a medial gap, and the planar inverse anapole microresonator produces a magnetic field region that concentrates a magnetic field localized between the medial tip of the first inverse anapolic pattern and the medial tip of the second inverse anapolic pattern in response to the planar inverse anapole microresonator being subjected to microwave radiation.

2. The planar inverse anapole microresonator of claim 1, further comprising a microstrip on which the anapolic substrate is disposed,
    wherein the anapolic substrate is interposed between the microstrip and the anapolic conductor.

3. The planar inverse anapole microresonator of claim 1, wherein the microstrip comprises:
    a dielectric substrate; and
    a microwave conductor disposed on the dielectric substrate and that receives microwave radiation and communicates the microwave radiation to subject the inverse anapolic pattern to the microwave radiation and produce the magnetic field region.

4. The planar inverse anapole microresonator of claim 1, wherein the anapolic substrate is adjustably disposed on the microstrip such that the medial arm of the first inverse anapolic pattern and the medial arm of the second inverse anapolic pattern are rotationally adjustable with respect to the microwave conductor.

5. The planar inverse anapole microresonator of claim 4, wherein a coupling angle between the medial arm of the first inverse anapolic pattern and the medial arm of the second inverse anapolic pattern and the microwave conductor is from 0° to 90°.

6. The planar inverse anapole microresonator of claim 5, wherein the coupling angle is variable to obtain critically coupling of the inverse anapolic pattern to the microwave conductor for CW operation of the planar inverse anapole microresonator, and over-coupling of the inverse anapolic pattern to the microwave conductor for pulsed operation of the planar inverse anapole microresonator.

7. The planar inverse anapole microresonator of claim 2, further comprising a first modulation coil and a second modulation coil between which is disposed the inverse anapolic pattern.

8. The planar inverse anapole microresonator of claim 2, further comprising a terminator in communication with the microwave conductor and that receives the microwave radiation from the microwave conductor.

9. The planar inverse anapole microresonator of claim 2, further comprising a microwave source in communication with the microwave conductor and that produces the microwave radiation and communicates the microwave radiation to the microwave conductor.

10. The planar inverse anapole microresonator of claim 1, wherein a frequency of the microwave radiation is from 9 GHz to 34 GHz.

11. The planar inverse anapole microresonator of claim 1, wherein the anapolic conductor is planar.

12. A process for performing inductive-detection electron paramagnetic resonance spectroscopy, the process comprising:
communicating microwave radiation through a microwave conductor;
subjecting an inverse anapolic pattern in an anapolic conductor to the microwave radiation from the microwave conductor; and
creating a magnetic field region and concentrating a magnetic field localized between a medial tip of a first inverse anapolic pattern and a medial tip of a second inverse anapolic pattern of the inverse anapolic pattern in response to subjecting the inverse anapolic pattern to the microwave radiation from the microwave conductor to perform inductive detection electron paramagnetic resonance spectroscopy.

13. The process of claim 12, further comprising:
disposing an analyte on the anapolic conductor in the magnetic field region; and
subjecting the analyte to the magnetic field.

14. The process of claim 13, further comprising:
adjusting a position of the inverse anapolic pattern relative to the microwave conductor; and
changing microwave coupling between the inverse anapolic pattern and the microwave conductor in response to adjusting the position of the inverse anapolic pattern relative to the microwave conductor.

15. The process of claim 14, further comprising subjecting the analyte to external radiation from a modulation coil.

16. The process of claim 13, further comprising acquiring an electron paramagnetic resonance spectrum by detecting the microwave radiation that is reflected by a terminator connected to the microwave conductor after subjecting the analyte to the magnetic field.

17. The process of claim 13, wherein a frequency of the microwave radiation is from 9 GHz to 35 GHz.

* * * * *